US012813049B2

(12) United States Patent
Kim et al.

(10) Patent No.: US 12,813,049 B2
(45) Date of Patent: Nov. 24, 2026

(54) DISPLAY DEVICE

(71) Applicant: Samsung Display Co., LTD., Yongin-si (KR)

(72) Inventors: Hong Am Kim, Yongin-si (KR); Sujeong Kim, Yongin-si (KR); Young Min Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 364 days.

(21) Appl. No.: 18/429,674

(22) Filed: Feb. 1, 2024

(65) Prior Publication Data

US 2024/0355981 A1 Oct. 24, 2024

(30) Foreign Application Priority Data

Apr. 19, 2023 (KR) ........................ 10-2023-0051505

(51) Int. Cl.
*H10W 90/00* (2026.01)
*H10H 20/857* (2025.01)

(52) U.S. Cl.
CPC .......... *H10H 20/857* (2025.01); *H10W 90/00* (2026.01)

(58) Field of Classification Search
None
See application file for complete search history.

(56) References Cited

U.S. PATENT DOCUMENTS 7,432,213 B2 10/2008 Peng et al.
7,771,205 B2 8/2010 Shiramizu et al.
7,876,122 B2 1/2011 Noumi et al.
8,013,454 B2 9/2011 Yamashita et al.
8,749,262 B2 6/2014 Jung et al.
9,591,754 B2 3/2017 Lee
10,910,409 B2 * 2/2021 Lee ..................... G02F 1/13458
11,201,199 B2 12/2021 Nam et al.
11,457,531 B2 9/2022 Bae et al.
11,495,591 B2 11/2022 Lee et al.
11,730,028 B2 8/2023 Cho et al.
2012/0044432 A1 * 2/2012 Yeh ..................... G02F 1/13458 349/33
2022/0037445 A1 * 2/2022 Cho ..................... H10K 59/131
2022/0164065 A1 5/2022 Han et al.
(Continued)

FOREIGN PATENT DOCUMENTS

CN 101779525 A 7/2010
JP 2006013421 A 1/2006
JP 2009224564 A 10/2009
(Continued)

*Primary Examiner* — Bradley Smith

(74) *Attorney, Agent, or Firm* — CANTOR COLBURN LLP

(57) ABSTRACT

An embodiment of the present disclosure provides a display device including: a substrate including a display area and a pad portion outside the display area; and a plurality of pads positioned in the pad portion. The plurality of pads are positioned in six rows, the six rows are arranged along the first direction, pads adjacent in the first direction among the plurality of pads are positioned on different layers, pads adjacent to each other in a second direction among the plurality of pads are positioned in the same layer, and the second direction is perpendicular to the first direction and parallel to a direction in which the rows extend.

14 Claims, 26 Drawing Sheets

(56) References Cited

U.S. PATENT DOCUMENTS

| | | | |
|---|---|---|---|
| 2022/0276523 | A1 | 9/2022 | Park et al. |
| 2022/0317529 | A1 | 10/2022 | Gong et al. |

FOREIGN PATENT DOCUMENTS

| | | | |
|---|---|---|---|
| JP | 2009237280 | A | 10/2009 |
| JP | 2014082282 | A | 5/2014 |
| KR | 1020040075377 | A | 8/2004 |
| KR | 1020050023121 | A | 3/2005 |
| KR | 1020060112521 | A | 11/2006 |
| KR | 1020120073765 | A | 7/2012 |
| KR | 1020130124882 | A | 11/2013 |
| KR | 1020140053626 | A | 5/2014 |
| KR | 1020150022211 | A | 3/2015 |
| KR | 1020150054454 | A | 5/2015 |
| KR | 1020160084746 | A | 7/2016 |
| KR | 1020180041301 | A | 4/2018 |
| KR | 1020180062508 | A | 6/2018 |
| KR | 1020190023855 | A | 3/2019 |
| KR | 1020190090896 | A | 8/2019 |
| KR | 1020190110980 | A | 10/2019 |
| KR | 1020200019650 | A | 2/2020 |
| KR | 1020200132809 | A | 11/2020 |
| KR | 1020210100795 | A | 8/2021 |
| KR | 1020220007799 | A | 1/2022 |
| KR | 1020220016364 | A | 2/2022 |
| KR | 1020220016407 | A | 2/2022 |
| KR | 1020220073346 | A | 6/2022 |
| KR | 1020220100146 | A | 7/2022 |

* cited by examiner

DISPLAY DEVICE

This application claims priority to Korean Patent Application No. 10-2023-0051505, filed on Apr. 19, 2023, and all the benefits accruing therefrom under 35 U.S.C. § 119, the content of which in its entirety is herein incorporated by reference.

BACKGROUND

(a) Field

The present disclosure relates to a display device.

(b) Description of the Related Art

In general, a display device includes a display area for displaying an image and a peripheral area positioned around the display area.

An electronic device such as an integrated circuit may be positioned in the peripheral area to generate or transmit an electrical signal applied to the display area.

As resolution of an image displayed in the display area increases, the number of wires that transmit electrical signals applied to the display area increases, and the number of pads corresponding to these wires and to which bumps of electronic elements are coupled also increases.

SUMMARY

Embodiments have been made in an effort to provide a display device with an increased number of pads.

An embodiment of the present disclosure provides a display device including: a substrate including a display area and a pad portion outside the display area; and a plurality of pads positioned in the pad portion, where the pads are positioned in six rows arranged along the first direction, pads adjacent in the first direction are positioned on different layers, pads adjacent to each other in a second direction are positioned in the same layer, and the second direction is perpendicular to the first direction and parallel to a direction in which the rows extend.

The pads may be connected to wires, and 1 to 5 wires may be positioned between two pads adjacent to each other in the second direction.

The distance between pads adjacent in the second direction may be in the range of about 25 micrometers (μm) to about 30 μm.

The width of each of the pads in the second direction may be in the range of about 5 μm to about 10 μm.

The width of each of the wires in the second direction may be in the range of about 2 μm to about 4 μm.

The distance between the wires adjacent in the second direction may be in the range of about 0.75 μm to about 4 μm.

The wires adjacent in the second direction may be positioned on different layers.

some of the wires may include one or more bent portions.

The number of pads positioned in the pad portion may be in the range of 6500 to 7500.

The pad portion may include: first pads positioned in the same layer as a first gate conductive layer of the display area; and second pads positioned in the same layer as a second gate conductive layer of the display area, and the first pads and the second pads may be alternately positioned along the first direction, and only the first pads or only the second pads may be positioned in the same row extending in the second direction.

The pad portion may include: second pads positioned in the same layer as a second gate conductive layer of the display area; and third pads positioned in the same layer as a third gate conductive layer of the display area, and the second pads and the third pads may be alternately positioned along the first direction, and only the second pads or only the third pads may be positioned in the same row extending in the second direction.

The pad portion may include: first pads positioned in the same layer as a first gate conductive layer of the display area; and third pads positioned in the same layer as a third gate conductive layer of the display area, and the first pads and the third pads may be alternately positioned along the first direction, and only the first pads or only the third pads may be positioned in the same row extending in the second direction.

The display device may further include: first wires connected to the first pads and positioned in the same layer as the first pads; and third wires connected to the third pads and positioned in the same layer as the third pads, and the first wires and the third wires may partially overlap in a direction perpendicular to a major surface of the substrate.

The display device may further include an auxiliary pad positioned on the pads and electrically connected to the pads, and the auxiliary pad may be positioned in the same layer as a data conductive layer of the display area.

Another exemplary embodiment of the present disclosure provides a display device including: a substrate including a display area and a pad portion outside the display area; and a plurality of pads arranged in the pad portion along a first direction and a second direction perpendicular to the first direction, and the pads includes first pads, second pads, and third pads positioned on different layers, the pads are positioned in six rows arranged along the first direction, and the first pads, the second pads, and the third pads are alternately positioned along the first direction.

The first pads, the second pads, and the third pads may be alternately positioned along the second direction.

Pads positioned in the same layer may be arranged along a third direction diagonal between the first direction and the second direction.

Only the first pads, only the second pads, or only the third pads may be positioned in the same row extending in the second direction.

The pads may be connected to wires, and 1 to 5 wires may be positioned between two pads adjacent to each other in the second direction.

The distance between pads adjacent in the second direction may be in the range of about 25 μm to about 30 μm.

The width of each of the pads in the second direction may be in the range of about 5 μm to about 10 μm.

The width of each of the wires in the second direction may be in the range of about 2 μm to about 4 μm.

The distance between the wires adjacent in the second direction may be in the range of about 0.75 μm to about 4 μm.

The wires adjacent in the second direction may be positioned on different layers.

Some of the wires may include one or more bent portions.

The first pads may be positioned in the same layer as a first gate conductive layer of the display area, the second pads may be positioned in the same layer as a second gate conductive layer of the display area, and the third pads may be positioned in the same layer as a third gate conductive layer of the display area.

The display device may further include: first wires connected to the first pads and positioned in the same layer as the first pads; second wires connected to the second pads and positioned in the same layer as the second pads; and third wires connected to the third pads and positioned in the same layer as the third pads, and the first wires and the third wires may partially overlap in a direction perpendicular to a major surface of the substrate.

The number of pads positioned in the pad portion may be in the range of 6500 to 7500.

The display device may further include an auxiliary pad positioned on the pads and electrically connected to the pads, and the auxiliary pad may be positioned in the same layer as a data conductive layer of the display area.

According to the embodiments, it is possible to provide a display device with an increased number of pads.

DETAILED DESCRIPTION

Figure 1:
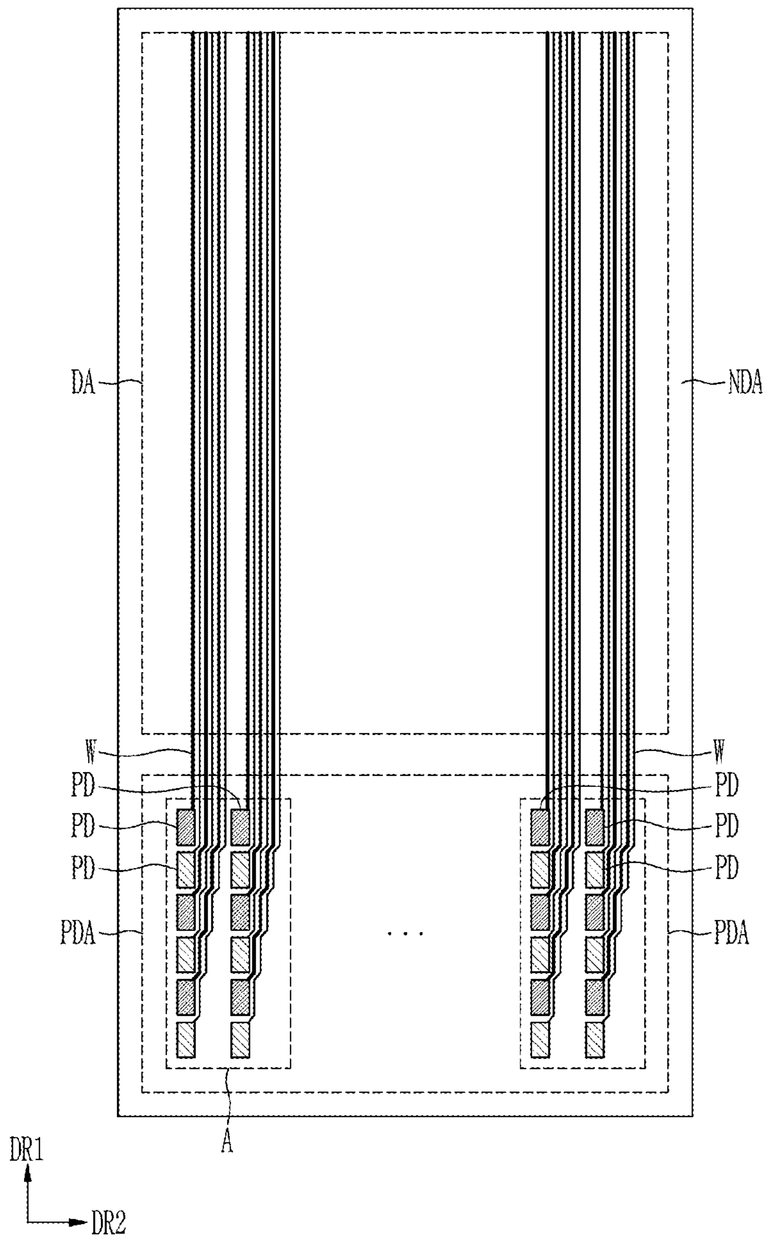
FIG. 1 schematically illustrates a display device according to an embodiment.

The present invention will be described more fully hereinafter with reference to the accompanying drawings, in which embodiments of the invention are shown.

As those skilled in the art would realize, the described embodiments may be modified in various ways, all without departing from the spirit or scope of the present invention.

To clearly describe the present invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present invention is not limited to the illustrated sizes and thicknesses.

In the drawings, the thicknesses of layers, films, panels, regions, etc., are exaggerated for clarity.

In the drawings, for better understanding and ease of description, the thicknesses of some layers and areas are exaggerated.

It should be understood that when an element such as a layer, film, region, or substrate is referred to as being “on” another element, it can be directly on the other element or intervening elements may also be present.

In contrast, when an element is referred to as being “directly on” another element, there are no intervening elements present.

Further, in the specification, the word “on” or “above” means positioned on or below the object portion, and does not necessarily mean positioned on the upper side of the object portion based on a gravitational direction.

In addition, unless explicitly described to the contrary, the word “comprise” and variations such as “comprises” or “comprising” should be understood to imply the inclusion of stated elements but not the exclusion of any other elements.

Further, throughout the specification, the phrase “in a plan view” means when an object portion is viewed from above, and the phrase “in a cross-sectional view” means when a cross-section taken by vertically cutting an object portion is viewed from the side.

It will be understood that, although the terms “first,” “second,” “third” etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, “a first element,” “component,” “region,” “layer” or “section” discussed below could be termed a second element, component, region, layer or section without departing from the teachings herein.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within ±30%, 20%, 10% or 5% of the stated value.

Hereinafter, a display device according to an embodiment will be described in detail with reference to the drawings.

FIG. 1 schematically illustrates a display device according to an embodiment.

Referring to FIG. 1, a plurality of pixels according to the present embodiment include a display area (DA) for displaying an image and a peripheral area (NDA) positioned around the display area (DA).

The peripheral area (NDA) includes a pad portion (PDA), which is an area to which various electronic devices, printed circuit boards, or the like are electrically attached.

A plurality of pads (PD) may be positioned in the pad portion (PDA), and the pads (PD) are connected to pixels of the display area (DA) through wires (W) to transmit signals.

As illustrated in FIG. 1, in the display device according to the present embodiment, the pads (PD) may be positioned in six rows arranged along a first direction (DR1), and the present disclosure relates to an arrangement of the pads (PD).

That is, the display device according to the present embodiment is formed by arranging the pads (PD) in six rows and integrating the pads (PD) in the same space, thereby realizing a high-resolution display device.

In this case, it may be formed such that distances between the pads (PD) and the wires (W) are minimized by positioning the pads (PD) neighboring in a second direction (DR2) in the same layer and the pads (PD) neighboring in the first direction (DR1) on different layers.

A specific arrangement form and the size of the pads (PD) and the wires (W), the distance, etc. will be described in detail with reference to FIG. 3 hereinafter.

Figure 2:
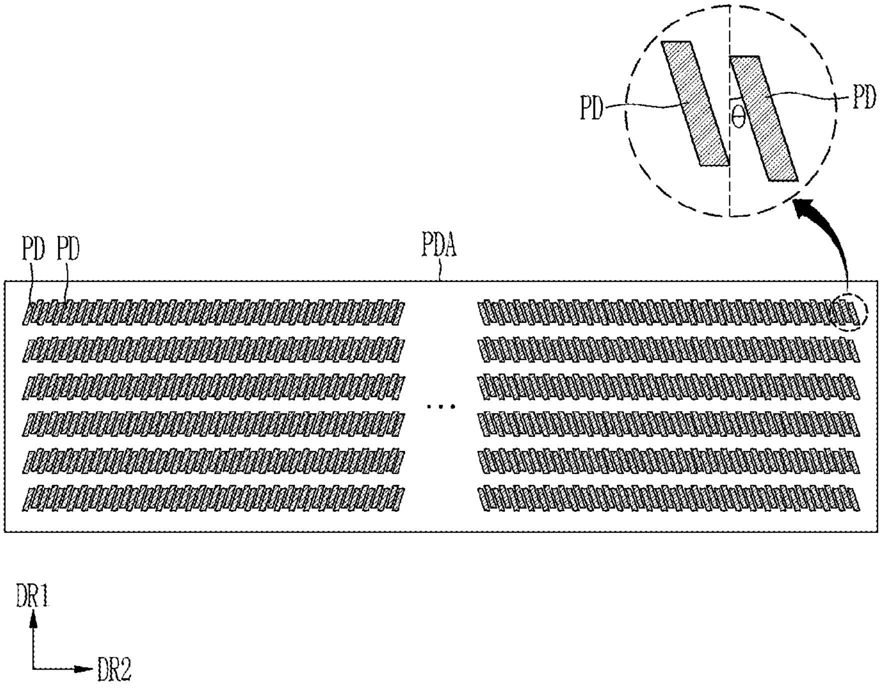
FIG. 2 separately illustrates a pad portion in a display device according to an embodiment.

FIG. 2 separately illustrates a pad portion (PDA) in a display device according to an embodiment.

As illustrated in FIG. 2, the pads (PD) are positioned in six rows arranged in the first direction (DR1) in the pad portion (PDA).

As shown in FIG. 2, the pads (PD) may be formed in an inclined shape from the center to an edge, and the pad (PD) positioned at the center may be positioned vertically along the first direction (DR1).

As such, if the pads (PD) are formed such that inclined directions are different according to positions thereof, alignment for contacting the pads (PD) may be easy, and a contact area of the pads (PD) may be increased.

That is, the contact area of the pad portion (PDA) may be increased through a change in a position of an integrated circuit contacting the pad portion (PDA) in the first direction (DR1).

In this case, an inclined angle (θ) of the pad (PD) positioned at the edge with respect to a straight line perpendicular to the first direction (DR1) may be 15 degrees to 20 degrees.

This inclined angle (θ) decreases toward the center and may become 0 degrees at the center.

In the present embodiment, the number of pads (PD) included in the pad portion (PDA) may be 6500 or more—for example, 6500 to 7500.

Although it will be separately described later, the pads according to the present embodiment are arranged in six rows and adjacent pads are formed on different layers to minimize the distance between the pads and the wires, thereby increasing the degree of integration.

Accordingly, a plurality of pads (PD) may be formed in the same space, and a high-resolution display device may be implemented.

As the number of pads increases, health-related sensors such as multiple fingerprint implementation, body composition, blood pressure, and stress measurement may be added without a separate driver.

Figure 3:
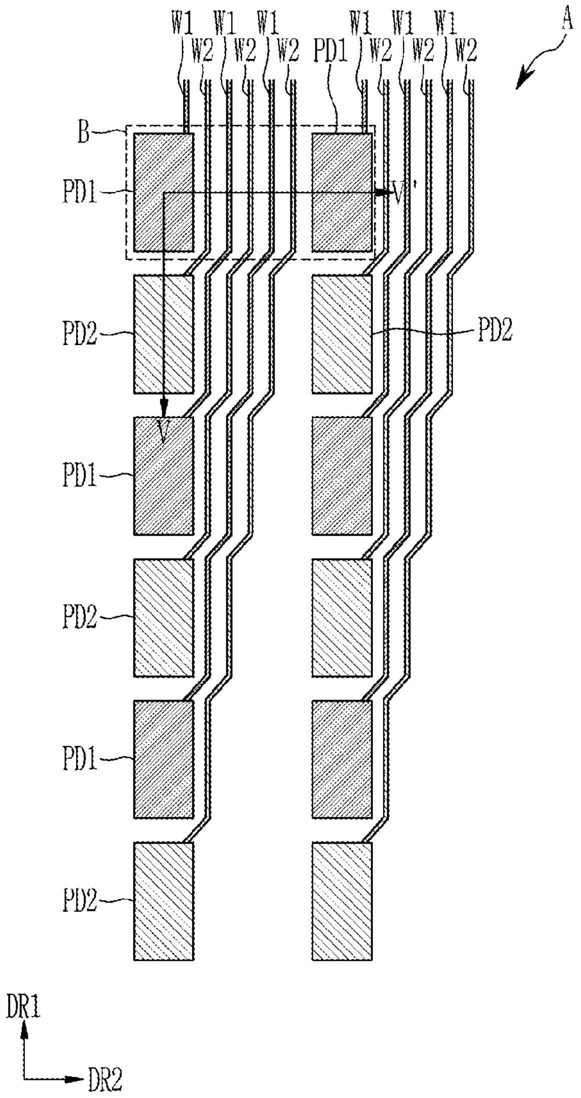
FIG. 3 illustrates a separate view of a portion indicated by “A” in FIG. 1.

FIG. 3 illustrates a separate view of a portion indicated by "A" in FIG. 1.

Referring to FIG. 3, in the pad portion (PDA) according to the present embodiment, the pads (PD) are positioned in six rows.

That is, as illustrated in FIG. 3, six pads (PD) may be positioned side by side along the first direction (DR1).

In this case, neighboring pads in the first direction (DR1) may be positioned on different layers.

In FIG. 3, pads neighboring in the second direction (DR2) may be positioned in the same layer.

That is, some of the pads may be positioned in the same layer as a first gate conductive layer (See GAT1 in FIG. 6) of the display area (DA), which will be referred to as first pads (PD1).

In this case, wires connected to the first pads (PD1) and positioned in the same layer as the first gate conductive layer are referred to as first wires (W1).

In addition, some pads may be positioned in the same layer as a second gate conductive layer (See GAT2 in FIG. 6) of the display area (DA), which will be referred to as second pads (PD2).

In this case, wires connected to the second pads (PD2) and positioned on the same layer as the second gate conductive layer are referred to as second wires (W2).

That is, the first gate conductive layer may exist both in the display area (DA) and the pad portion (PDA), and in the pad portion (PDA), the first gate conductive layer may include the first pads (PD1) and the first wires (W1). The second gate conductive layer may exist both in the display area (DA) and the pad portion (PDA), and in the pad portion (PDA), the second gate conductive layer may include the second pads (PD1) and the second wires (W1)

The first gate conductive layer and the second gate conductive layer of the display area (DA) will be separately described later with reference to FIG. 18 to FIG. 26.

Referring to FIG. 3, the first pads (PD1) and the second pads (PD2) are alternately positioned along the first direction (DR1).

In addition, only the first pads (PD1) or only the second pads (PD2) may be positioned in the same row along the second direction (DR2).

That is, a row in which the first pads (PD1) are positioned and a row in which the second pads (PD2) are positioned may be alternately formed.

As illustrated in FIG. 3, in a first row in the second direction (DR2), three second wires (W2) and two first wires (W1) may be alternately positioned between adjacent first pads (PD1).

Next, in a second row, two second wires (W2) and two first wires (W1) may be alternately positioned between adjacent second pads (PD2).

Referring to FIG. 3, the first wires (W1) connected to the first pads (PD1) and the second wires (W2) connected to the second pads (PD2) may include bent portions.

Wires connected to each of the pads arranged in six rows arranged along the first direction should be positioned between two pads adjacent to each other in the second direction (DR2), and thus some of the wires may include the bent portion. In an embodiment, the bent portion may be positioned between the first pads (PD1) and the second pads (PD2).

In FIG. 3, the first wires (W1) connected to the first pads (PD1) positioned in the first row in the second direction (DR2)—that is, the first pads (PD1) positioned closest to the display area (DA)—may not include the bent portions.

However, the second wires (W2) connected to the second pads (PD2) positioned in a second row in the second direction (DR2) may include one bent portion.

Similarly, the first wires (W1) connected to the first pads (PD1) positioned in a third row in the second direction (DR2) may be bent twice.

Figure 4:
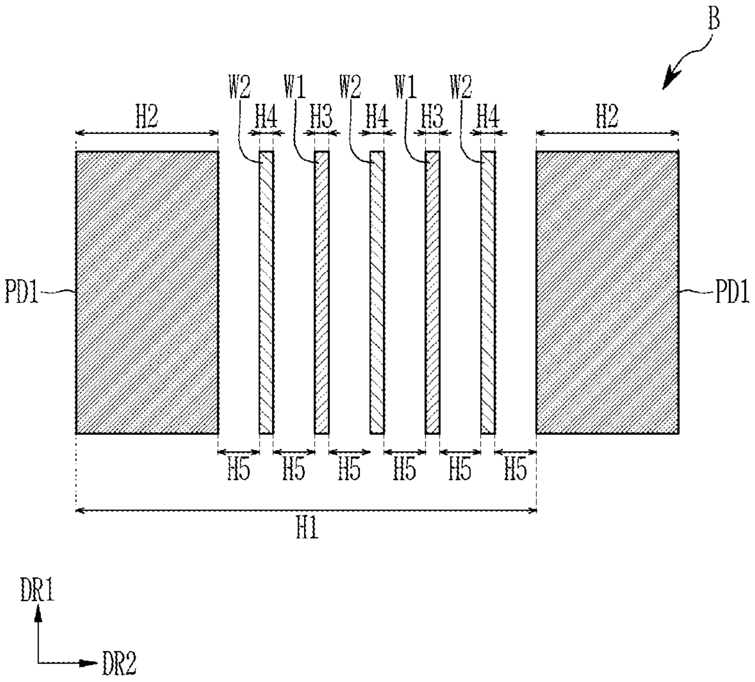
FIG. 4 illustrates an enlarged view of a portion “B” of FIG. 3.

FIG. 4 illustrates an enlarged view of a portion "B" of FIG. 3.

Referring to FIG. 4, the distance between the first pads (PD1) adjacent to each other in the second direction (DR2)—that is, a pitch (H1) of the pad—may be in the range of about 25 micrometers (μm) to about 30 μm.

In addition, a width (H2) of each of the first pads (PD1) in the second direction (DR2) may be in the range of about 5 μm to about 10 μm.

In an embodiment, a width (H3) of each of the first wires (W1) in the second direction (DR2) may be in the range of about 2 μm to about 4 μm.

In addition, in an embodiment, a width (H4) of each of the second wires (W2) in the second direction (DR2) may be in the range of about 2 μm to about 4 μm.

Widths (H3) of the first wires (W1) may be the same or different.

Similarly, widths (H4) of the second wires (W2) may be the same or different.

The widths of the first wires (W1) and the second wires (W2) may be the same or different.

In FIG. 4, in an embodiment, each of the distance (H5) between the first pad (PD1) and the first wire (W1) adjacent to each other, and the distance (H5) between the second wire (W2) and the first wire (W1) adjacent to each other in the second direction (DR2) may be in the range of about 0.75 μm to about 4 μm.

In another embodiment, the distances (H5) between the respective wires may be the same or different.

In order to integrally form pads in a high-resolution display device, it is desirable to minimize the distance between the pads and wires.

However, coupling problems may occur if the distance between the pads and the wires becomes close, and it is not easy to reduce the distance between the pads and the wires below a certain level.

In this case, a minimum distance between wires located in the same layer may be about 3 μm or more, but a minimum distance between the wires positioned on different layers is about 0.75 μm or more, which may be smaller than the minimum distance between the wires positioned in the same layer.

This is because an insulating layer or the like is positioned between the wires when the wires are positioned on different layers, thereby reducing coupling.

Accordingly, in the display device according to the present embodiment, the wires (W1 and W2) connected to the pads (PD1 and PD2) in the pad portion (PDA) are alternately positioned on different layers.

Accordingly, the distance between the wires may be minimized without severe coupling problems, and a plurality of pads may be formed in the same space due to an integrated arrangement of the pads and wires.

That is, in the present embodiment, the pitch (H1) of the pads is in the range of about 25 μm to about 30 μm, and one pad (PD1) and up to five wires (W1 and W2) may be positioned within the pitch (H1) without severe coupling problems.

The number of wires included in one pitch (H1) decreases as the distance from the display area (DA) increases.

In this case, since the neighboring wires are positioned on different layers, the distance between the wires may be minimized.

FIG. 3 and FIG. 4 illustrate a portion where the pads (PD) are not inclined, but as described above with reference to FIG. 2, the pads (PD) may be inclined at a certain angle (θ) at the edge with respect to the first direction DR1.

Figure 5:
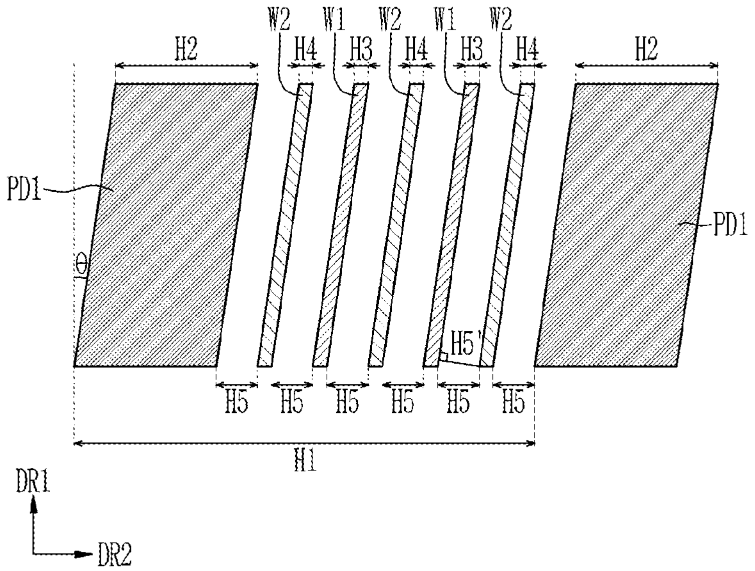
FIG. 5 illustrates pads and wires in another area.

FIG. 5 illustrates the pad (PD) and the wires (W1 and W2) in another area.

Referring to FIG. 5, the first pad (PD1), the first wire (W1), and the second wire (W2) each are inclined at an angle (θ) with respect to the first direction DR1.

In this case, the inclined angle (θ) may be greater than 0 degree and less than 20 degrees.

Even in this case, the pitch (H1) of the pads may be about 25 μm to about 30 μm, and the width (H2) of the first pad (PD1) in the second direction (DR2) may be about 5 μm to about 10 μm.

In an embodiment, a width (H3) of each of the first wires (W1) in the second direction (DR2) may be in the range of about 2 μm to about 4 μm.

In addition, in an embodiment, a width (H4) of each of the second wires (W2) in the second direction (DR2) may be in the range of about 2 μm to about 4 μm. Widths (H3) of the first wires (W1) may be the same or different.

Similarly, widths (H4) of the second wires (W2) may be the same or different.

The widths of the first wires (W1) and the second wires (W2) may be the same or different.

Similarly, in an embodiment, each of the distance (H5) between the first pad (PD1) and the first wire (W1) adjacent to each other, and the distance (H5) between the second wire (W2) and the first wire (W1) adjacent to each other—that is, the distance parallel to the second direction (DR2)—may be about 0.75 μm to about 4 μm.

In this case, an orthogonal distance (H5') may be shorter than the distance (H5). The orthogonal distance (H5') may be defined as a distance between the first wire (W1) and the second wire (W2) adjacent to each other in a direction perpendicular to the inclined direction of the first wire (W1).

A minimum distance to prevent coupling between the wires is based on the orthogonal distance, and thus the distance (H5) near the pads positioned around an edge of the display device may be greater than the minimum distance.

That is, when the minimum distance for preventing coupling between the wires is about 0.75 μm, the distance (H5) between the wires in the second direction (DR2) may be greater than about 0.75 μm.

For example, the distance (H5) near the pads positioned around the edge of the display device may have a greater value than the distance (H5) between the pads positioned in the center in the second direction (DR2).

In an embodiment, the pitch (H1) of the pads in the second direction (DR2) may be about 28 μm, and the width (H2) of the first pad (PD1) in the second direction (DR2) may be about 8 μm.

The width (H3) of the first wire (W1) in the second direction (DR2) may be about 2.5 μm, and the width (H4) of the second wire (W2) in the second direction (DR2) may be about 2.8 μm.

In addition, the each of the distance (H5) between the first pad (PD1) and the first wire (W1) adjacent to each other, and the distance (H5) between the second wire (W2) and the first wire (W1) adjacent to each other—that is, a distance parallel to the second direction (DR2)—may be about 1.1 μm.

Figure 6:
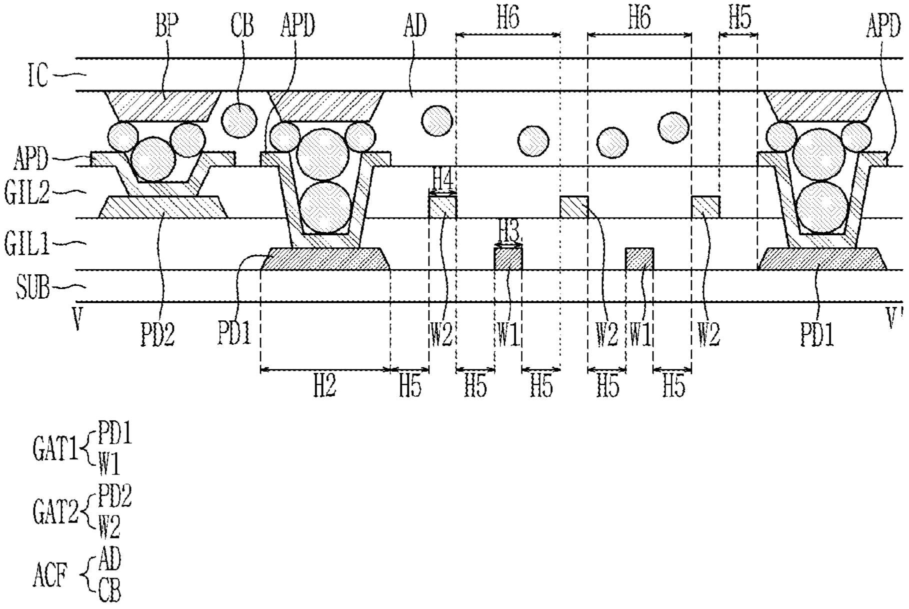
FIG. 6 illustrates a cross-sectional view taken along line V-V of FIG. 3.

FIG. 6 illustrates a cross-sectional view taken along line V-V of FIG. 3.

Referring to FIG. 6, a first gate conductive layer (GAT1) is positioned on a substrate (SUB), and the first gate conductive layer (GAT1) includes a first pad (PD1) and a first wire (W1).

The first gate conductive layer (GAT1) may include molybdenum (Mo), aluminum (Al), copper (Cu) and/or titanium (Ti), and may have a single layer structure or a multilayer structure of the material.

The first gate insulating layer (GIL1) is positioned on the first gate conductive layer (GAT1), and a second gate conductive layer (GAT2) is positioned on the first gate insulating layer (GIL1).

The first gate insulating layer (GIL1) may include an inorganic insulating material such as a silicon nitride (SiNx), a silicon oxide (SiOx), and a silicon oxynitride (SiOxNy).

The first gate insulating layer (GIL1) may have a single layer structure or a multilayer structure of the material.

The second gate conductive layer (GAT2) may include molybdenum (Mo), aluminum (Al), copper (Cu), and/or titanium (Ti), and may have a single layer structure or a multilayer structure of the material.

The second gate conductive layer (GAT2) includes a second pad (PD2) and a second wire (W2).

Referring to FIG. 6, the neighboring first pad (PD1) and the second wire (W2) are spaced apart from each other by the predetermined distance (H5) in the second direction (DR2).

Similarly, the first wire (W1) and the second wire (W2) that are adjacent to each other are spaced apart by the predetermined distance (H5) in the second direction (DR2).

As described above, the distance (H5) between the wires may be about 0.75 μm to about 4 μm.

In addition, the distance (H6) between the first wire (W1) and the first wire (W1) positioned in the same layer may be greater than or equal to about 3 μm.

That is, in the case of all wires positioned in the same layer, a minimum distance between two adjacent wires is about 3 μm or more, but in the present embodiment, the distance (H5) between the neighboring wires in the second direction (DR2) is effectively reduced by positioning the adjacent wires on different layers.

Accordingly, wires may be densely formed, and a large number of pads may be formed in the same space.

Referring to FIG. 6, a second gate insulating layer (GIL2) is positioned on the second gate conductive layer (GAT2).

The second gate insulating layer (GIL2) may include an inorganic insulating material such as a silicon nitride ($SiN_x$), a silicon oxide ($SiO_x$), and a silicon oxynitride ($SiO_xN_y$).

The first gate insulating layer (GIL1) and the second gate insulating layer (GIL2) define openings exposing the first pad (PD1) and the second pad (PD2), respectively.

An auxiliary pad (APD) may be positioned on the second gate insulating layer (GIL2).

The auxiliary pad (APD) may contact the first pad (PD1) and the second pad (PD2) at openings of the first gate insulating layer (GIL1) and the second gate insulating layer (GIL2), respectively.

Such auxiliary pads (APD) may be formed in the same layer as a data conductive layer of the display area (DA), and may include the same material as the material of the data conductive layer of the display area (DA).

These auxiliary pads (APD) may have a single layer or a multi-layer structure.

For example, the auxiliary pads (APD) may have a multi-layered structure including a first data conductive layer and a second data conductive layer.

The auxiliary pads (APD) may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), etc., and may have a single layer structure or a multilayer structure of the material.

An integrated circuit (IC) may be positioned to overlap the pad portion (PDA).

The integrated circuit (IC) may include a plurality of bumps (BP).

These bumps (BP) may be electrically connected to the auxiliary pads (APD).

To this end, an anisotropic conductive film (ACF) may be provided between the auxiliary pad (APD) and the bump (BP).

The anisotropic conductive film (ACF) includes an adhesive member (AD) and a conductive ball (CB).

The adhesive member (AD) has an adhesive force, and thus an electronic device such as an integrated circuit (IC) is adhered to the auxiliary pad (APD) on the substrate (SUB).

In this case, the conductive ball (CB) may be provided between the bump (BP) of the electronic device such as the integrated circuit (IC) and the auxiliary pad (APD), so that the bump (BP) may be electrically connected to the corresponding auxiliary pad (APD) through the conductive ball (CB).

In FIG. 3 to FIG. 6, an embodiment in which the first pad (PD1) is positioned in the same layer as the first gate conductive layer (GAT1) of the display area (DA) and the second pad (PD2) is positioned in the same layer as the second gate conductive layer (GAT2) of the display area (DA) has been described, but the present disclosure is not limited thereto.

That is, the first pad (PD1) may be positioned in the same layer as the second gate conductive layer (GAT2) of the display area (DA), and the second pad (PD2) may be positioned in the same layer as the first gate conductive layer (GAT1) of the display area (DA).

In addition, the first pad (PD1) may be positioned in the same layer as the first gate conductive layer (GAT1) of the display area (DA), and a third pad (PD3) positioned in the same layer as the third gate conductive layer (GAT3) of the display area may be included instead of the second pad (PD2).

Figure 7:
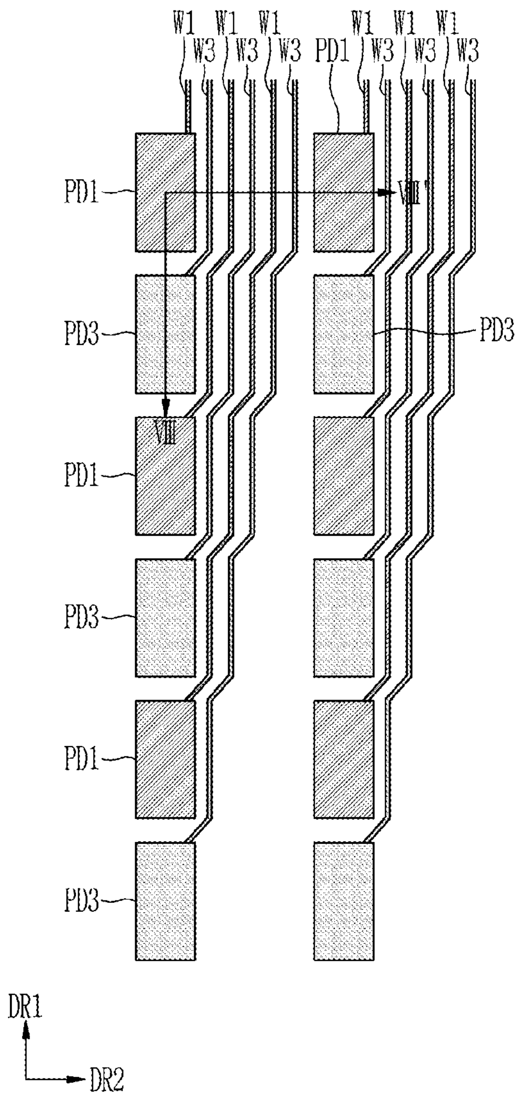
FIG. 7 illustrates another embodiment of FIG. 3.

FIG. 7 illustrates a separate view of a portion indicated by “A” in FIG. 1 for another embodiment.

The embodiment of FIG. 7 is the same as that of FIG. 3 except that the first pad (PD1) is positioned in the same layer as the first gate conductive layer (GAT1) of the display area (DA), and the third pad (PD3) is positioned in the same layer as the third gate conductive layer (GAT3) of the display area (DA). That is, the third gate conductive layer may exist both in the display area (DA) and the pad portion (PDA), and in the pad portion (PDA), the third gate conductive layer may include the third pads (PD3) and the third wires (W3).

A detailed description of same constituent elements will be omitted.

The first gate conductive layer, the second gate conductive layer, and the third gate conductive layer of the display area (DA) will be separately described later with reference to FIG. 18 to FIG. 26.

Figure 8:
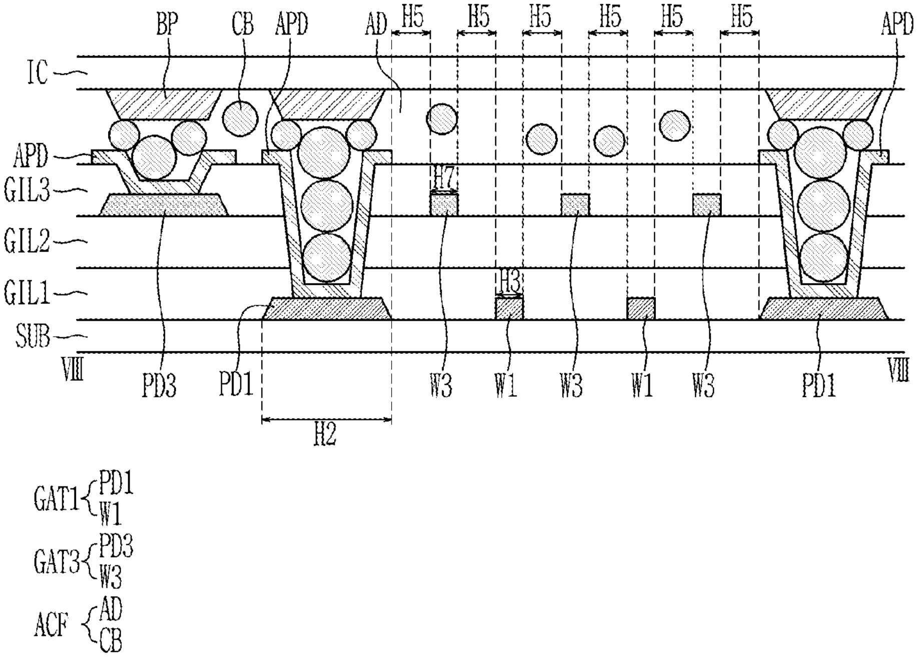
FIG. 8 illustrates a cross-sectional view taken along line VIII-VIII' of FIG. 7.

FIG. 8 illustrates a cross-sectional view taken along line VIII-VIII' of FIG. 7, and the embodiment of FIG. 8 is the same as that of FIG. 6 except that the first pad (PD1) is positioned in the same layer as the first gate conductive layer (GAT1) of the display area (DA), and the third pad (PD3) is positioned in the same layer as the third gate conductive layer (GAT3) of the display area (DA).

A detailed description of same constituent elements will be omitted.

Referring to FIG. 8, a first gate conductive layer (GAT1) is positioned on a substrate (SUB), and the first gate conductive layer (GAT1) includes a first pad (PD1) and a first wire (W1). A first gate insulating layer (GIL1) and a second gate insulating layer (GIL2) are positioned on the first gate conductive layer (GAT1).

A third gate conductive layer (GAT3) is positioned on the second gate insulating layer (GIL2), and the third gate conductive layer (GAT3) includes a third pad (PD3) and a third wire (W3).

A width (H7) of the third wire (W3) may be about 2 μm to about 4 μm.

The third gate conductive layer (GAT3) may include molybdenum (Mo), aluminum (Al), copper (Cu), and/or titanium (Ti), and may have a single-layer structure or a multilayer structure of the material. A third gate insulating layer (GIL3) is positioned on the third gate conductive layer (GAT3).

The third gate insulating layer (GIL3) may include an inorganic insulating material such as a silicon nitride ($SiN_x$), a silicon oxide ($SiO_x$), and a silicon oxynitride ($SiO_xN_y$).

The third gate insulating layer (GIL3) may have a single-layer structure or a multilayer structure of the material.

The first gate insulating layer (GIL1), the second gate insulating layer (GIL2), and the third gate insulating layer (GIL3) each have an opening exposing the first pad (PD1) and the third pad (PD3).

An auxiliary pad (APD) may be positioned on the third gate insulating layer (GIL3).

The auxiliary pad (APD) may contact the first pad (PD1) and the third pad (PD3) at openings of the first gate insulating layer (GIL1), the second gate insulating layer (GIL2), and the third gate insulating layer (GIL3), respectively.

In addition, the second pad (PD2) may be positioned in the same layer as the second gate conductive layer (GAT2) of the display area (DA), and the third pad (PD3) may be positioned in the same layer as the third gate conductive layer (GAT3) of the display area (DA).

Figure 9:
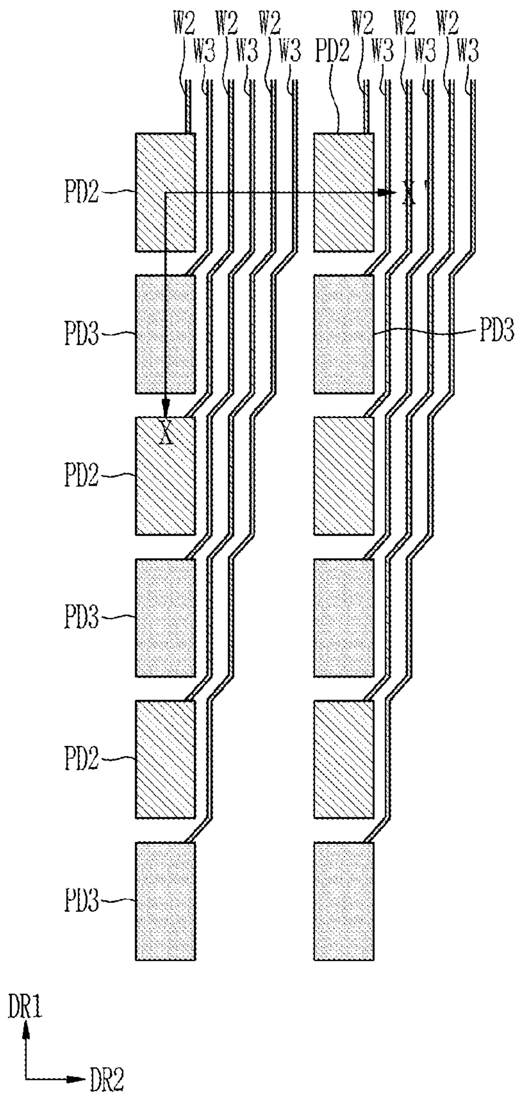
FIG. 9 illustrates another embodiment of FIG. 7.

FIG. 9 illustrates a separate view of a portion indicated by "A" in FIG. 1 according to still another embodiment.

The embodiment of FIG. 9 is the same as that of FIG. 7 except that the second pad (PD2) is positioned in the same layer as the second gate conductive layer (GAT2) of the display area (DA), and the third pad (PD3) is positioned in the same layer as the third gate conductive layer (GAT3) of the display area (DA).

A detailed description of same constituent elements will be omitted.

Figure 10:
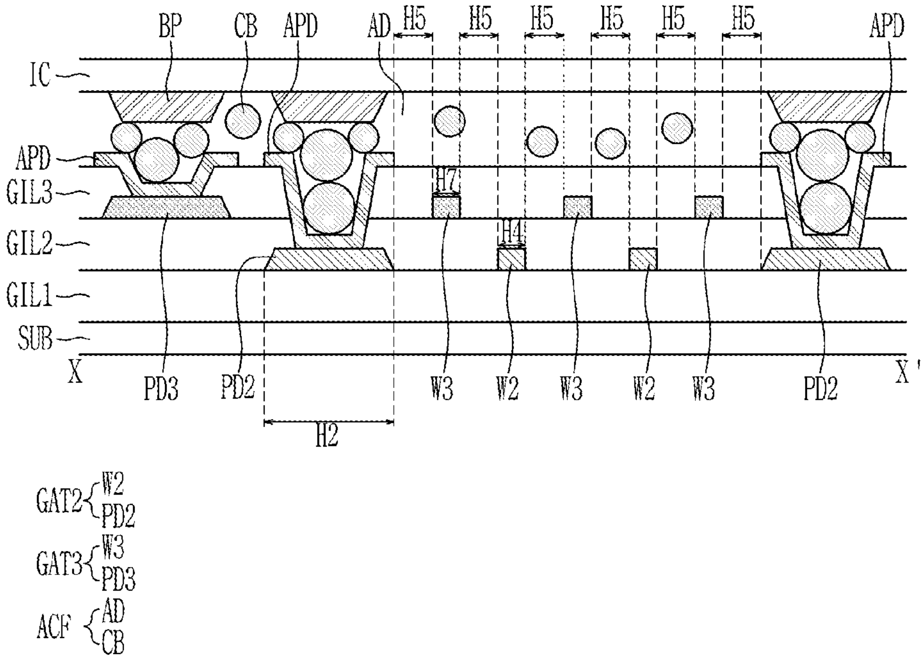
FIG. 10 illustrates a cross-sectional view taken along line X-X' of FIG. 9.

FIG. 10 illustrates a cross-sectional view taken along line X-X' of FIG. 9, and the embodiment of FIG. 8 is the same as that of FIG. 8 except that the second pad (PD2) is positioned in the same layer as the second gate conductive layer (GAT2) of the display area (DA), and the third pad (PD3) is positioned in the same layer as the third gate conductive layer (GAT3) of the display area (DA).

A detailed description of same constituent elements will be omitted.

Referring to FIG. 10, a first gate insulating layer (GIL1) is positioned on the substrate (SUB), and a second gate conductive layer (GAT2) is positioned on the first gate insulating layer (GIL1).

The second gate conductive layer (GAT2) includes a second pad (PD2) and a second wire (W2), and a second gate insulating layer (GIL2) is positioned on the second gate conductive layer (GAT2).

A third gate conductive layer (GAT3) is positioned on the second gate insulating layer (GIL2), and the third gate conductive layer (GAT3) includes a third pad (PD3) and a third wire (W3).

A third gate insulating layer (GIL3) is positioned on the third gate conductive layer (GAT3).

The second gate insulating layer (GIL2) and the third gate insulating layer (GIL3) have openings exposing the second pad (PD2) and the third pad (PD3), respectively.

An auxiliary pad (APD) may be positioned on the third gate insulating layer (GIL3).

The auxiliary pad (APD) may contact the second pad (PD2) and the third pad (PD3) at openings of the second gate insulating layer (GIL2) and the third gate insulating layer (GIL3), respectively.

Previously, the pads were divided into two types positioned on different layers, but according to another embodiment, the pads may include three types positioned on different layers.

Figure 11:
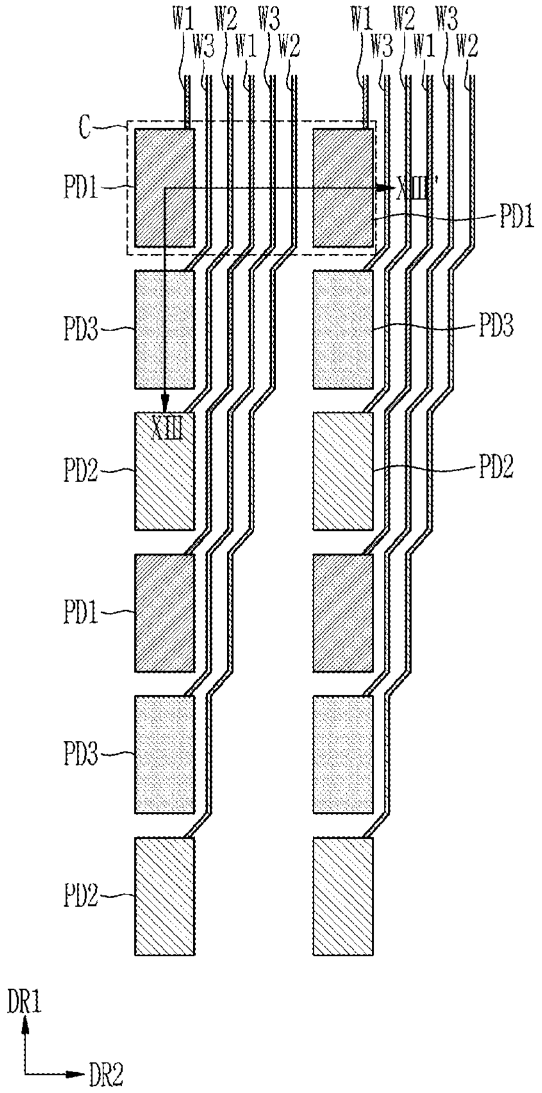
FIG. 11 illustrates still another embodiment of FIG. 3.

FIG. 11 illustrates a separate view of a portion indicated by "A" in FIG. 1 for another embodiment.

The embodiment of FIG. 11 is the same as that of FIG. 3 except that the first pad (PD1) is positioned in the same layer as the first gate conductive layer (GAT1) of the display area (DA), the second pad (PD2) is positioned in the same layer as the second gate conductive layer (GAT2) of the display area (DA), and the third pad (PD3) is positioned in the same layer as the third gate conductive layer (GAT3) of the display area (DA).

A detailed description of some constituent elements will be omitted.

In this case, referring to FIG. 11, pads of the same type are positioned in the second direction (DR2).

In addition, the first pad (PD1), the second pad (PD2), and the third pad (PD3) are alternately positioned in the first direction (DR1).

Figure 12:
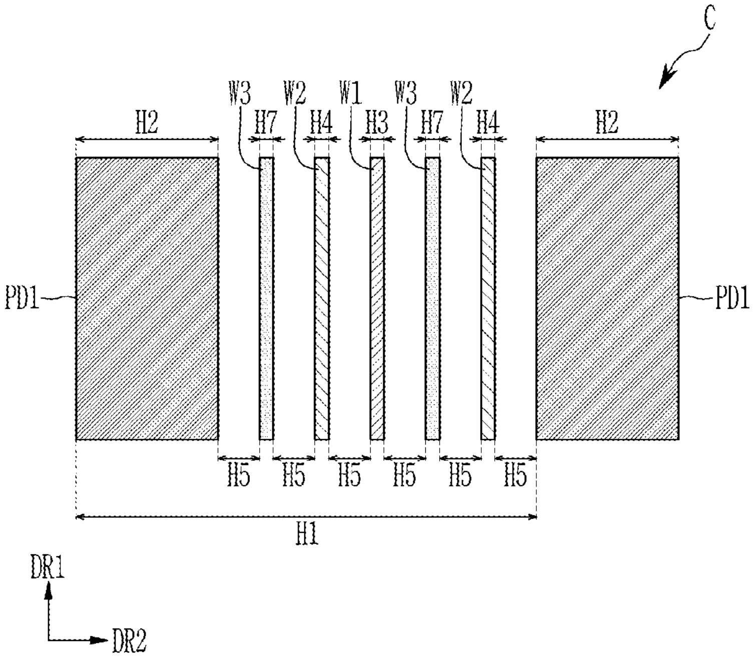
FIG. 12 illustrates an enlarged view of a portion “C” of FIG. 11.

FIG. 12 illustrates an enlarged view of a portion "C" of FIG. 11.

Referring to FIG. 12, the width (H2) of the first pad (PD1) in the second direction (DR2) may be in the range of about 5 μm to about 10 μm.

A width (H3) of each of the first wires (W1) in the second direction (DR2) may be in the range of about 2 μm to about 4 μm.

In addition, a width (H4) of each of the second wires (W2) in the second direction (DR2) may be in the range of about 2 μm to about 4 μm.

A width (H7) of each of the third wires (W3) in the second direction (DR2) may be in the range of about 2 μm to about 4 μm.

Widths (H3) of the first wires W1 may be the same or different.

Similarly, widths (H4) of the second wires (W2) may be the same or different.

Similarly, the width (H7) of each of the third wires (W3) may be the same or different.

The widths of the first wires (W1), the second wires (W2), and the third wires (W3) may be the same or different.

In FIG. 12, in an embodiment, each of the distance (H5) between the first pad (PD1) and the first wire (W1) adjacent to each other, and the distance (H5) between the second wire (W2) and the first wire (W1) adjacent to each other may be in the range of about 0.75 μm to about 4 μm.

In this case, the distances (H5) between the wires may be the same or different.

Figure 13:
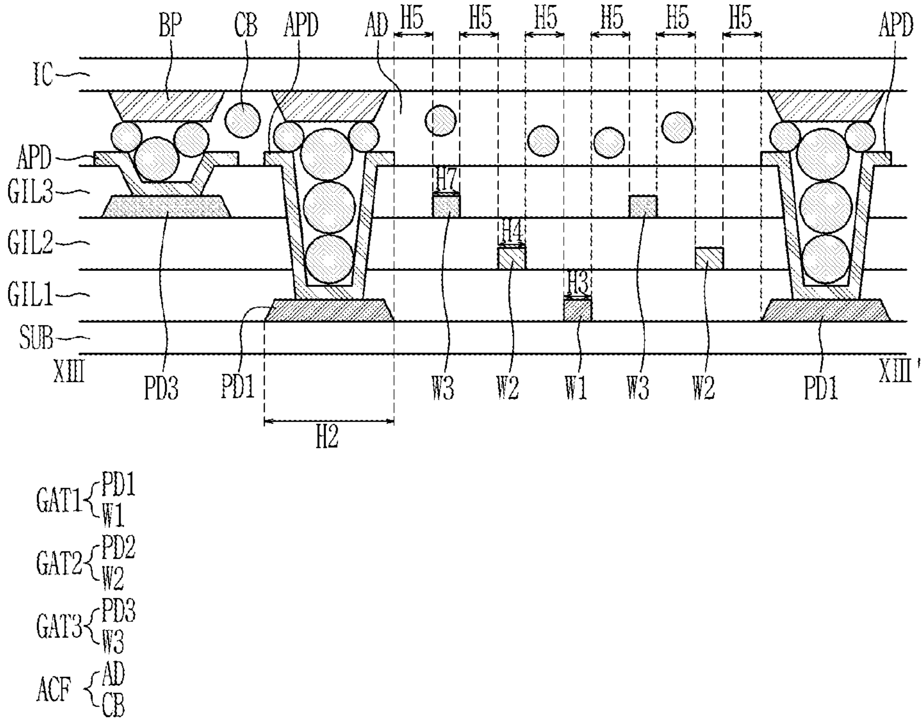
FIG. 13 illustrates a cross-sectional view taken along line XIII-XIII' of FIG. 11.

FIG. 13 illustrates a cross-sectional view taken along line XIII-XIII' of FIG. 11, and the embodiment of FIG. 13 is the same as that of FIG. 8 except that the first pad (PD1) of the display area is positioned in the same layer as the first gate conductive layer (GAT1) of the display area (DA), the second pad (PD2) is positioned in the same layer as the second gate conductive layer (GAT2) of the display area (DA), and the third pad (PD3) is positioned in the same layer as the third gate conductive layer (GAT3) of the display area (DA).

A detailed description of same constituent elements will be omitted.

A first gate conductive layer (GAT1) is positioned on a substrate (SUB), and the first gate conductive layer (GAT1) includes a first pad (PD1) and a first wire (W1).

A first gate insulating layer (GIL1) is positioned on the substrate (SUB), and a second gate conductive layer (GAT2) is positioned on the first gate insulating layer (GIL1).

The second gate conductive layer (GAT2) includes a second pad (PD2) and a second wire (W2).

A second gate insulating layer (GIL2) is positioned on the second gate conductive layer (GAT2).

A third gate conductive layer (GAT3) is positioned on the second gate insulating layer (GIL2), and the third gate conductive layer (GAT3) includes a third pad (PD3) and a third wire (W3).

A third gate insulating layer (GIL3) is positioned on the third gate conductive layer (GAT3).

The first gate insulating layer (GIL1), the second gate insulating layer (GIL2), and the third gate insulating layer (GIL3) each have an opening exposing the first pad (PD1), the second pad (PD2), and the third pad (PD3).

An auxiliary pad (APD) may be positioned on the third gate insulating layer (GIL3).

The auxiliary pad (APD) may contact the first pad (PD1), the second pad (PD2), and the third pad (PD3) at openings of the first gate insulating layer (GIL1), the second gate insulating layer (GIL2), and the third gate insulating layer (GIL3), respectively.

Figure 14:
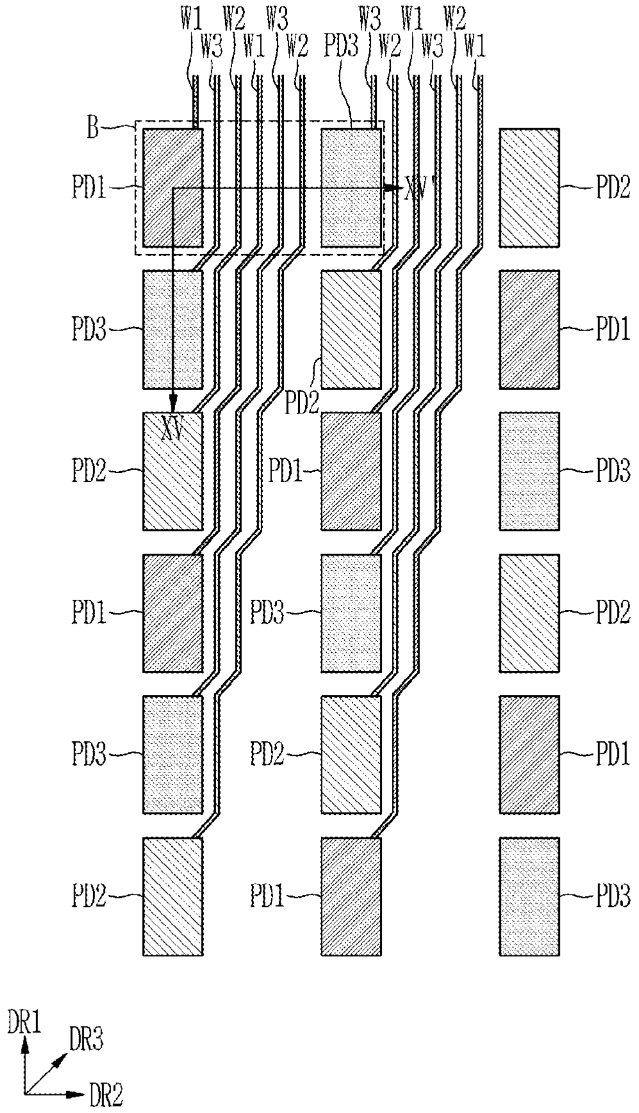
FIG. 14 illustrates another embodiment of FIG. 11.

FIG. 14 illustrates a separate view of a portion indicated by "A" in FIG. 1 according to another embodiment.

According to the embodiment of FIG. 14, the first pad (PD1) is positioned in the same layer as the first gate conductive layer (GAT1) of the display area (DA), the second pad (PD1) is positioned in the same layer as the second gate conductive layer (GAT2) of the display area (DA), and the third pad (PD3) is positioned in the same layer as the third gate conductive layer (GAT3) of the display area (DA).

In this case, the embodiment of FIG. 14 is the same as that of FIG. 11 except that the first pad (PD1), the second pad (PD2), and the third pad (PD3) are alternately positioned in the first direction (DR1), and the first pad (PD1), the second pad (PD2), and the third pad (PD3) are alternately positioned.

That is, the embodiment of FIG. 14 is different from FIG. 11 in that different pads are alternately positioned in the first direction (DR1) and the second direction (DR2).

As illustrated in FIG. 14, pads positioned in the same layer are arranged along a third direction (DR3) between the first and second directions (DR1 and DR2).

That is, as illustrated in FIG. 14, pads positioned in the same layer are positioned along the third direction (DR3), which is a diagonal direction between the first and second directions (DR1 and DR2).

A detailed description of same constituent elements will be omitted.

Figure 15:
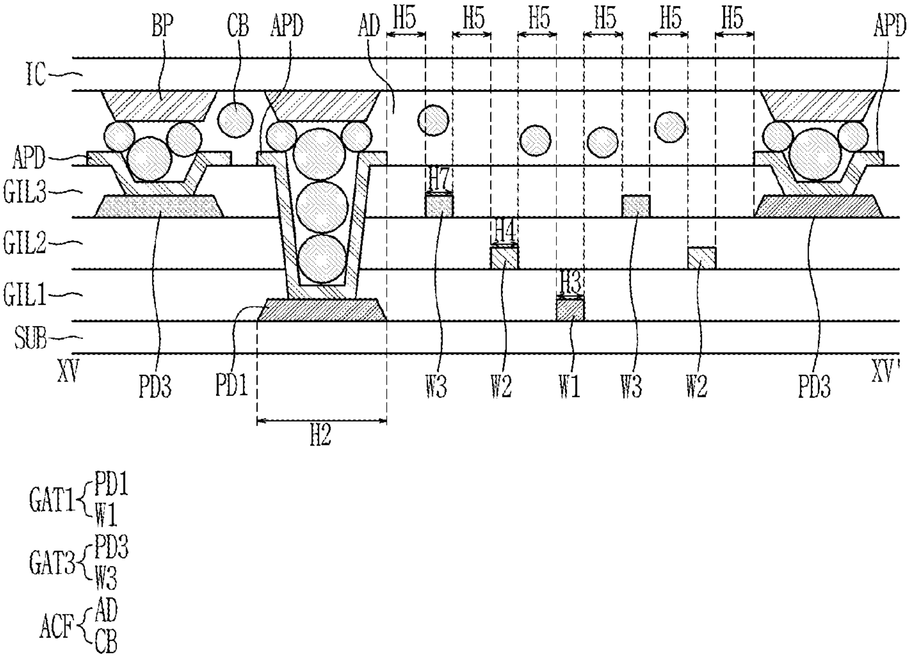
FIG. 15 illustrates a cross-sectional view taken along line XV-XV of FIG. 14.

FIG. 15 illustrates a cross-sectional view taken along line XV-XV' of FIG. 14, and the embodiment of FIG. 15 is the same as that of FIG. 13 except that it includes a first wire (W1), a second wire (W2), and a third wire (W3) positioned between the first pad (PD1) and the third pad (PD3).

A detailed description of same constituent elements will be omitted.

FIG. 14 illustrates a configuration in which the first pad (PD1), the third pad (PD3), and the second pad (PD2) are sequentially positioned in the first and second directions (DR1 and DR2), but in another embodiment, the first pad (PD1), the second pad (PD2), and the third pad (PD3) may be sequentially positioned.

In addition, in the previous embodiment, a configuration in which the first wire (W1), the second wire (W2), and the third wire (W3) positioned on different layers do not overlap each other in a direction perpendicular to the substrate (SUB) has been disclosed, but in some embodiments, the first wire (W1) and the third wire (W3) may be partially overlapped in the direction perpendicular to the substrate (SUB).

Figure 16:
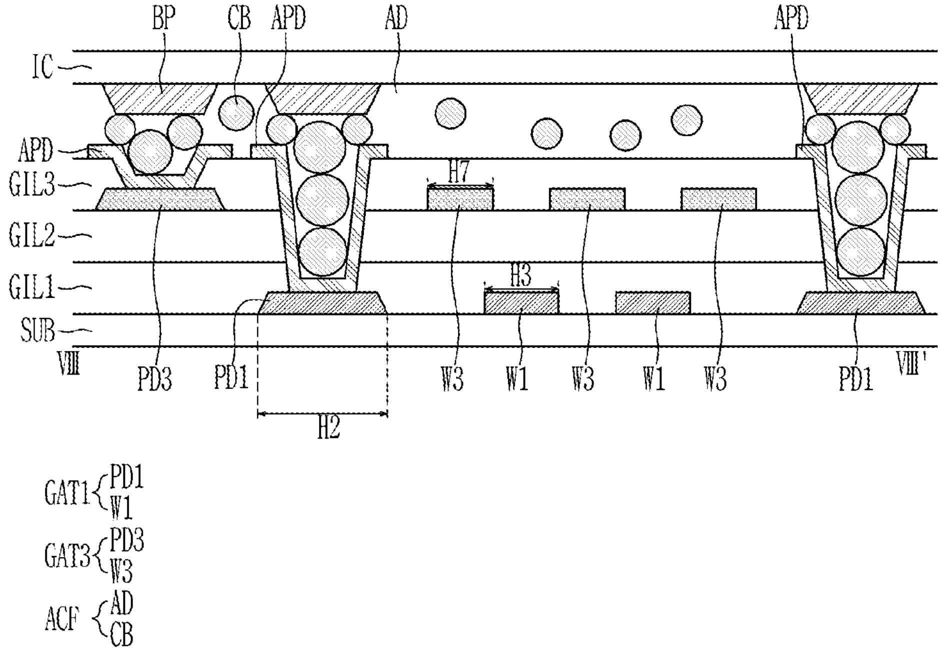
FIG. 16 illustrates a cross-section corresponding to another embodiment of FIG. 8.

FIG. 16 illustrates a cross-section corresponding to another embodiment of FIG. 8.

According to the embodiment of FIG. 16, the first pad (PD1) is positioned in the same layer as the first gate conductive layer (GAT1) of the display area (DA), and the third pad (PD3) is positioned in the same layer as the third gate conductive layer (GAT3) of the display area (DA). The embodiment of FIG. 16 is the same as that of FIG. 8 except that the first wire (W1) and the third wire (W3) partially overlap in a plan view (i.e., in a direction perpendicular to a major surface of the substrate). Here, the "major surface" of the substrate is parallel to a plane defined by the first direction (DR1) and the second direction (DR2).

A detailed description of same constituent elements will be omitted.

In the case of FIG. 16, the first gate insulating film (GIL1) and a second gate insulating film (GIL2) are positioned between the first wire (W1) and the third wire (W3), and thus even if the first wire (W1) and the third wire (W3) partially overlap in a direction perpendicular to the substrate (SUB), coupling may be effectively prevented by the first gate insulating layer (GIL1) and the second gate insulating layer (GIL2).

If the first wire (W1) and the third wire (W3) are partially overlapped in the plan view, the pitch between the adjacent pads (PD) may be effectively reduced, and the pads may be more integrated, which is advantageous in realizing high resolution.

Figure 17:
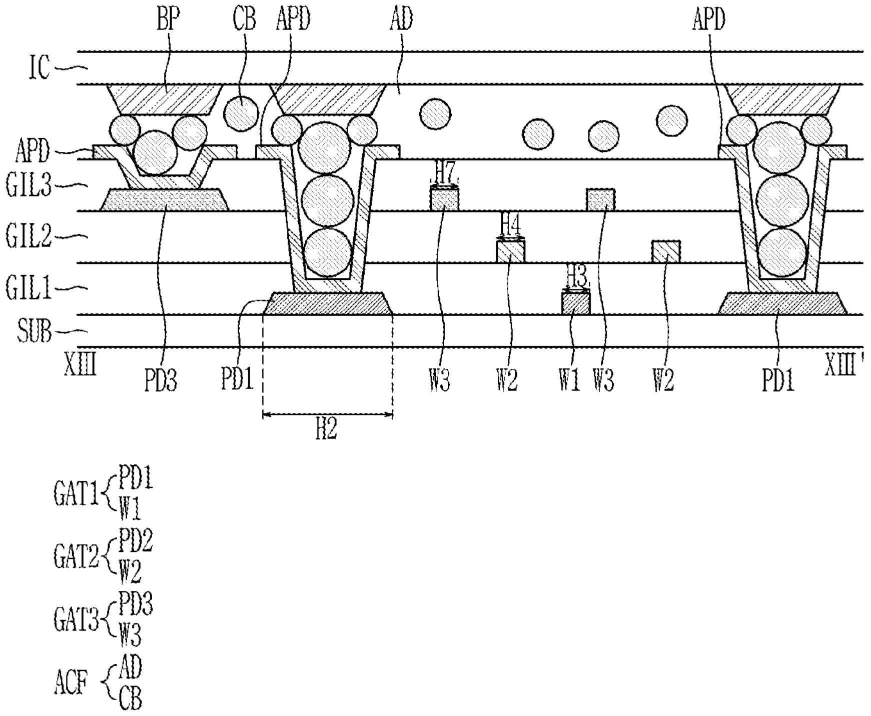
FIG. 17 illustrates a cross-section corresponding to another embodiment of FIG. 13.

FIG. 17 illustrates a cross-section corresponding to another embodiment of FIG. 13.

The embodiment of FIG. 17 is the same as that of FIG. 13 except that the first wire (W1) and the third wire (W3) partially overlap in a plan view.

A detailed description of same constituent elements will be omitted.

Referring to FIG. 17, the first gate insulating film (GIL1) and the second gate insulating film (GIL2) are positioned between the first wire (W1) and the third wire (W3), and thus even if the first wire (W1) and the third wire (W3) partially overlap in a direction perpendicular to the substrate (SUB) in a plan view, coupling may be prevented by the first gate insulating layer (GIL1) and the second gate insulating layer (GIL2).

If the first wire (W1) and the third wire (W3) partially overlap in a plan view, the pitch between the pads (PD1) may be effectively reduced, and the pads may be more integrated, which is advantageous in realizing high resolution.

Next, a stacked structure of the display area of the display device according to the present embodiment will be described.

However, the following description is only an example, and the structure of the display area is not limited to the following description.

The first gate conductive layer, the second gate conductive layer, and the third gate conductive layer of the display area described above may be as described below.

Figure 18:
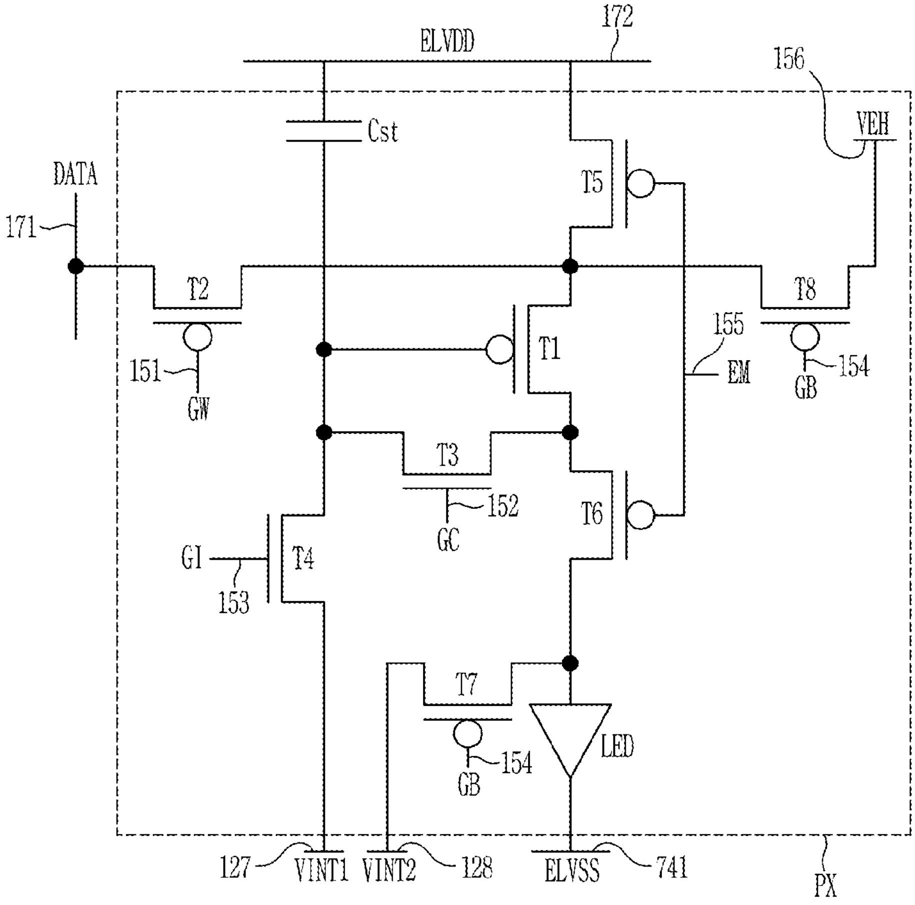
FIG. 18 illustrates a circuit diagram of a pixel of a display device according to an embodiment.

FIG. 18 illustrates a circuit diagram of a pixel of a display device according to an embodiment.

As illustrated in FIG. 18, according to the present embodiment, one pixel (PX) of the display device includes a plurality of transistors (T1, T2, T3, T4, T5, T6, T7, and T8), a holding capacitor (Cst), and a light emitting diode (LED) connected to various signal lines.

A plurality of signal lines (127, 128, 151, 152, 153, 154, 155, 156, 171, 172, and 741) are connected to one pixel (PX).

The signal lines include a first initialization voltage line (127), a second initialization voltage line (128), a first scan line (151), a second scan line (152), an initialization control line (153), a bypass control line (154), an emission control line (155), a reference voltage line (156), a data line (171), a driving voltage line (172), and a common voltage line (741).

The first scan line (151) is connected to a gate driver (not illustrated) to transfer a first scan signal (GW) to the second transistor (T2).

A voltage having a polarity that is opposite to a polarity of the voltage applied to the first scan line (151) may be applied to the second scan line (152) at the same timing as a signal of the first scan line (151).

In an embodiment, for example, when a high voltage is applied to the first scan line (151), a low voltage may be applied to the second scan line (152).

The second scan line (152) transmits a second scan signal (GC) to the third transistor (T3).

The initialization control line (153) transmits an initialization control signal (GI) to the fourth transistor (T4).

The bypass control line (154) transfers a bypass signal (GB) to the seventh transistor (T7) and the eighth transistor (T8).

The bypass control line (154) may be formed by a next-stage first scan line (151).

The emission control line (155) transmits an emission control signal (EM) to the fifth transistor (T5) and the sixth transistor (T6).

The data line (171) is a wire for transmitting a data voltage (DATA) generated by a data driver (not illustrated), and luminance of the organic light emitting diode (LED) that emits light is changed depending on the data voltage (DATA) applied to the pixel (PX).

The driving voltage line (172) applies a driving voltage (ELVDD), and the reference voltage line (156) applies a reference voltage (VEH).

The first initialization voltage line (127) transfers a first initialization voltage (VINT1), and the second initialization voltage line (128) transfers the second initialization voltage (VINT2).

The common voltage line (741) applies a common voltage (ELVSS) to a cathode of the light emitting diode (LED).

In the present embodiment, voltages applied to the driving voltage line (172), the reference voltage line (156), the first and second initialization voltage lines (127 and 128), and the common voltage line (741) may be constant voltages.

Hereinafter, the structure and connection relationship of the transistors will be described in detail.

The driving transistor (T1) may have a p-type transistor characteristic, and may include a polycrystalline semiconductor.

The driving transistor (T1) may receive a data voltage (DATA) depending on a switching operation of the second transistor (T2), and may supply a driving current to an anode of the light emitting diode (LED).

A brightness of the light emitting diode (LED) may be adjusted depending on the magnitude of the driving current output to the anode electrode of the light emitting diode (LED), and thus the brightness of the light emitting diode (LED) may be adjusted depending on the data voltage (DATA) applied to the pixel (PX).

For this purpose, a first region of the driving transistor (T1) is connected to the driving voltage line (172) via the fifth transistor (T5) by being positioned to receive the driving voltage (ELVDD).

In addition, the first region of the driving transistor (T1) is connected to a second region of the second transistor (T2) to receive the data voltage (DATA).

Meanwhile, a second region of the driving transistor (T1) is positioned to output a current toward the light emitting diode (LED), and is connected to an anode of the light emitting diode (LED) via the sixth transistor (T6).

In addition, the second region of the driving transistor (T1) transfers the data voltage (DATA) applied to the first region (3136) to the third transistor (T3).

Meanwhile, a gate electrode of the driving transistor (T1) is connected to a first electrode (hereinafter, referred to as a "second storage electrode") of the storage capacitor (Cst).

Accordingly, the voltage of the gate electrode of the driving transistor (T1) changes depending on the voltage stored in the storage capacitor (Cst), and the driving current output by the driving transistor (T1) changes accordingly.

In addition, the storage capacitor (Cst) serves to maintain the voltage of the gate electrode of the driving transistor (T1) to be constant during one frame.

The second transistor (T2) may have a p-type transistor characteristic, and may include a polycrystalline semiconductor.

The second transistor (T2) is a transistor that receives the data voltage (DATA) into the pixel (PX).

A gate electrode of the second transistor (T2) may be connected to the first scan line (151).

A first region of the second transistor (T2) is connected to the data line (171).

The second region of the second transistor (T2) is connected to the first region of the driving transistor (T1).

When the second transistor (T2) is turned on by a low voltage of the first scan signal (GW) transferred through the first scan line (151), the data voltage (DATA) transferred through the data line (171) is transferred to the first region of the driving transistor (T1).

The third transistor (T3) may have an n-type transistor characteristic, and may include an oxide semiconductor.

The third transistor (T3) electrically connects the second region of the driving transistor (T1) and the gate electrode of the driving transistor (T1).

As a result, it is a transistor in which a compensation voltage obtained by changing the data voltage (DATA) through the driving transistor (T1) is transferred to the second storage electrode of the storage capacitor (Cst).

A gate electrode of the third transistor (T3) is connected to the second scan line (152), and the first region (3136) of the third transistor (T3) is connected to the second region of the driving transistor (T1).

The second region (3138) of the third transistor (T3) is connected to the second storage electrode of the storage capacitor (Cst) and the gate electrode of the driving transistor (T1).

The third transistor (T3) is turned on by a high voltage among the second scan signals (GC) received through the second scan line (152), to connect the gate electrode of the driving transistor (T1) and the second region of the driving transistor (T1), and the voltage applied to the gate electrode of the driving transistor (T1) is transferred to the second storage electrode of the storage capacitor (Cst) and stored in the storage capacitor (Cst).

The fourth transistor (T4) may have an n-type transistor characteristic, and may include an oxide semiconductor.

The fourth transistor (T4) serves to initialize the gate electrode of the driving transistor (T1) and the second storage electrode of the storage capacitor (Cst).

The gate electrode of the fourth transistor (T4) is connected to the initialization control line (153), and a first region (4136) of the fourth transistor (T4) is connected to the first initialization voltage line (127).

A second region (4138) of the fourth transistor (T4) is connected to the second storage electrode of the storage capacitor (Cst) and the gate electrode of the driving transistor (T1) via the second region (3138) of the third transistor (T3).

The fourth transistor (T4) is turned on by a high voltage of the initialization control signal (GI) transferred through the initialization control line (153), and in this case, the first initialization voltage (VINT1) is transferred to the gate electrode of the driving transistor (T1) and the second storage electrode of the storage capacitor (Cst).

Accordingly, a voltage of the gate electrode of the driving transistor (T1) and the storage capacitor (Cst) are initialized.

The fifth transistor (T5) may have a p-type transistor characteristic, and may include a polycrystalline semiconductor.

The fifth transistor (T5) serves to transfer the driving voltage (ELVDD) to the driving transistor (T1).

A gate electrode of the fifth transistor (T5) is connected to the emission control line (155), a first region of the fifth transistor (T5) is connected to the driving voltage line (172), and a second region of the fifth transistor (T5) is connected to the first region of the driving transistor (T1).

The sixth transistor (T6) may have a p-type transistor characteristic, and may include a polycrystalline semiconductor.

The sixth transistor (T6) serves to transfer a driving current output from the driving transistor (T1) to the light emitting diode (LED).

The gate electrode of the sixth transistor (T6) is connected to the emission control line (155), a first region of the sixth transistor (T6) is connected to the second region of the driving transistor (T1), and a second region of the sixth transistor (T6) is connected to the anode of the light emitting diode (LED).

The seventh transistor (T7) may have a p-type transistor characteristic, and may include a polycrystalline semiconductor.

The seventh transistor (T7) serves to initialize the anode of the light emitting diode (LED).

A gate electrode of the seventh transistor (T7) is connected to the bypass control line (154), a first region of the seventh transistor (T7) is connected to the anode of the light emitting diode (LED), and a second region of the seventh transistor (T7) is connected to the second initialization voltage line (128).

When the seventh transistor (T7) is turned on by a low voltage of the bypass signal (GB), the second initialization voltage (VINT2) is applied to the anode of the light emitting diode (LED) to be initialized.

The eighth transistor (T8) may have a p-type transistor characteristic, and may include a polycrystalline semiconductor.

A gate electrode of the eighth transistor (T8) is connected to the bypass control line (154), a first region of the eighth transistor (T8) is connected to the reference voltage line (156), and a second region of the eighth transistor (T8) is connected to the first region of the driving transistor (T1).

When the eighth transistor (T8) is turned on by the low voltage of the bypass signal (GB), the reference voltage (VEH) is applied to the first region of the driving transistor (T1).

It has been stated above that one pixel includes eight transistors (T1 to T8) and one storage capacitor (Cst), but the present invention is not limited thereto, and a number of transistors, the number of capacitors, and their connection relationships may be variously changed.

In the present embodiment, the driving transistor (T1) may include a polycrystalline semiconductor.

In addition, the third transistor (T3) and the fourth transistor (T4) may each include an oxide semiconductor.

The second transistor (T2), the fifth transistor (T5), the sixth transistor (T6), the seventh transistor (T7), and the eighth transistor (T8) may include a polycrystalline semiconductor.

However, the present invention is not limited thereto, and at least one of the second transistor (T2), the fifth transistor (T5), the sixth transistor (T6), the seventh transistor (T7), or the eighth transistor (T8) may include an oxide semiconductor in another embodiment.

In the present embodiment, more stable driving may be achieved and reliability may be improved by allowing the third transistor (T3) and the fourth transistor (T4) to include a semiconductor material that is different from a material of the driving transistor (T1).

Hereinafter, planar and cross-sectional structures of the driving transistor (T1), the third transistor (T3), and the fourth transistor (T4) will be further described with reference to FIG. 19 to FIG. 26.

Figure 19:
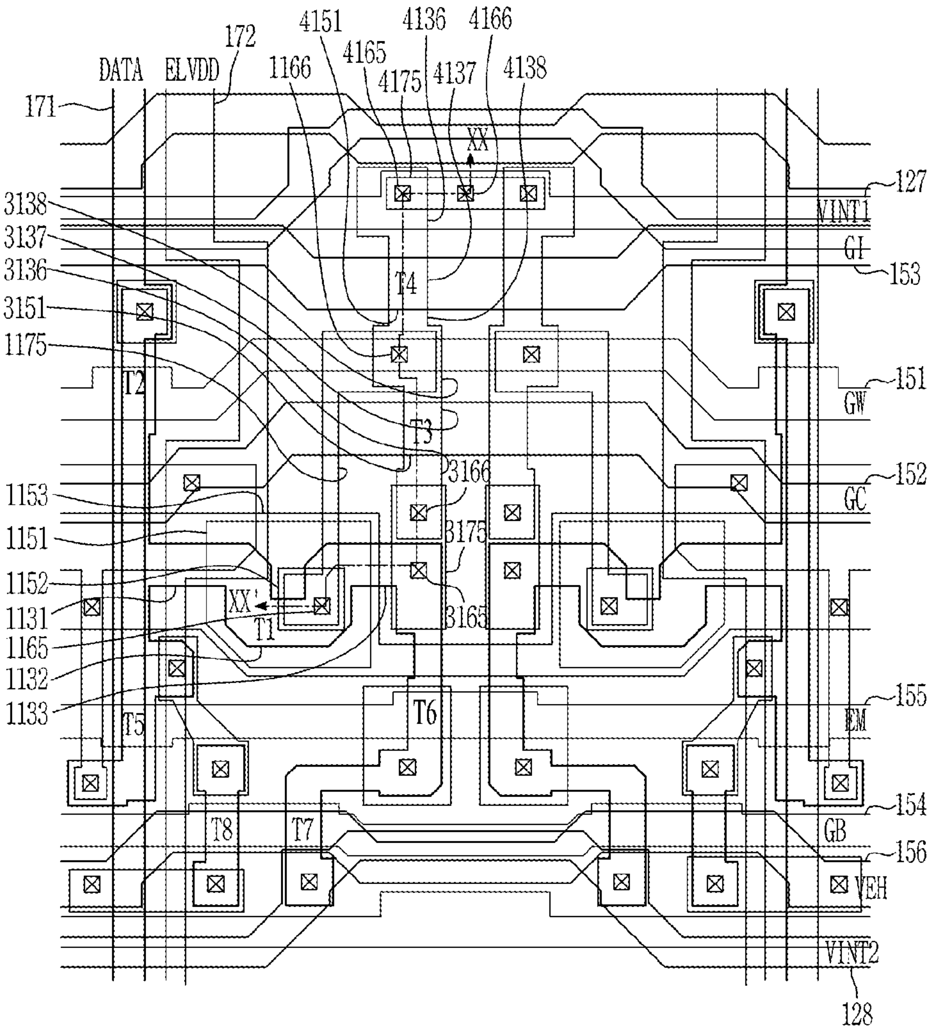
FIG. 19 illustrates a top plan view of a display device according to an embodiment.
Figure 20:
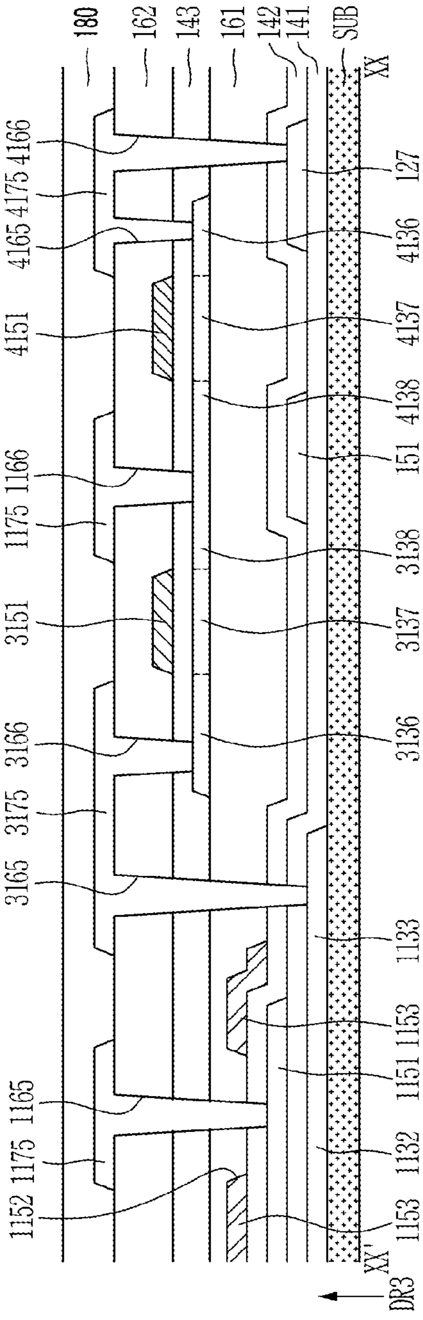
FIG. 20 illustrates a cross-sectional view taken along line XX-XX' of FIG. 19.

FIG. 19 illustrates a top plan view of a display device according to an embodiment, FIG. 20 illustrates a cross-sectional view taken along line XX-XX' of FIG. 19, and FIG. 21 to FIG. 26 illustrate top plan views sequentially showing a display device depending on the manufacturing order thereof according to an embodiment. FIG. 21 to FIG. 26 illustrate two adjacent pixels, and the two pixels may have shapes that are symmetrical to each other. Hereinafter, a pixel positioned at the left side will be mainly described.

As illustrated in FIG. 19 to FIG. 26, a polycrystalline semiconductor layer including the channel (1132) of the driving transistor (T1), the first region (1131), and the second region (1133) may be disposed on the substrate (SUB).

Figure 21:
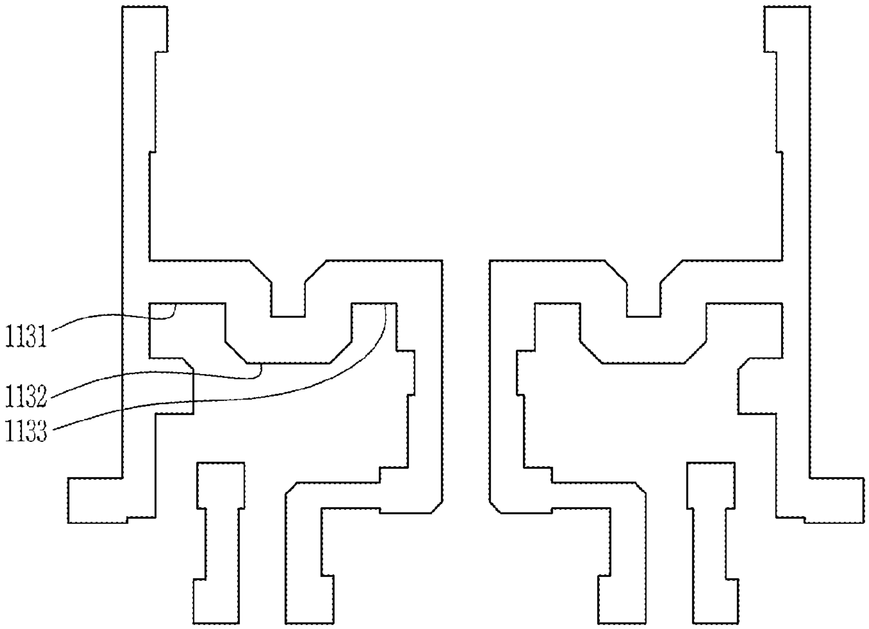
FIG. 21 to FIG. 26 illustrate top plan views sequentially showing a display device depending on a manufacturing order thereof according to an embodiment.

FIG. 21 illustrates the polycrystalline semiconductor layer.

The polycrystalline semiconductor layer may further include a channel, a first region, and a second region of each of not only the driving transistor (T1) but also the second transistor (T2), the fifth transistor (T5), the sixth transistor (T6), the seventh transistor (T7), and the eighth transistor (T8).

The channel (1132) of the driving transistor (T1) may have a bent shape in a plan view.

However, the shape of the channel (1132) of the driving transistor (T1) is not limited thereto, and may be variously changed.

In an embodiment, for example, the channel (1132) of the driving transistor (T1) may be bent in a different shape, or may be formed in a bar-like shape.

The first region (1131) and the second region (1133) of the driving transistor (T1) may be positioned at opposite sides of the channel (1132) of the driving transistor (T1).

The first region (1131) of the driving transistor (T1) extends upward and downward in a plan view, the portion extending upward may be connected to the second region of the second transistor (T2), and the portion extending downward may be connected to the second region of the fifth transistor (T5).

The second region (1133) of the driving transistor (T1) may extend downward in a plan view to be connected to the first region of the sixth transistor (T6).

A first gate insulating layer (141) may be disposed on the polycrystalline semiconductor layer including the channel (1132), the first region (1131), and the second region (1133) of the driving transistor (T1).

The first gate insulating layer (141) may include a silicon nitride ($SiN_x$), a silicon oxide ($SiO_x$), or a silicon oxynitride ($SiO_xN_y$), and may have a single- or multi-layered structure including the same.

A first gate conductive layer including a gate electrode (1151) of the driving transistor (T1) may be positioned on the first gate insulating layer (141).

Figure 22:
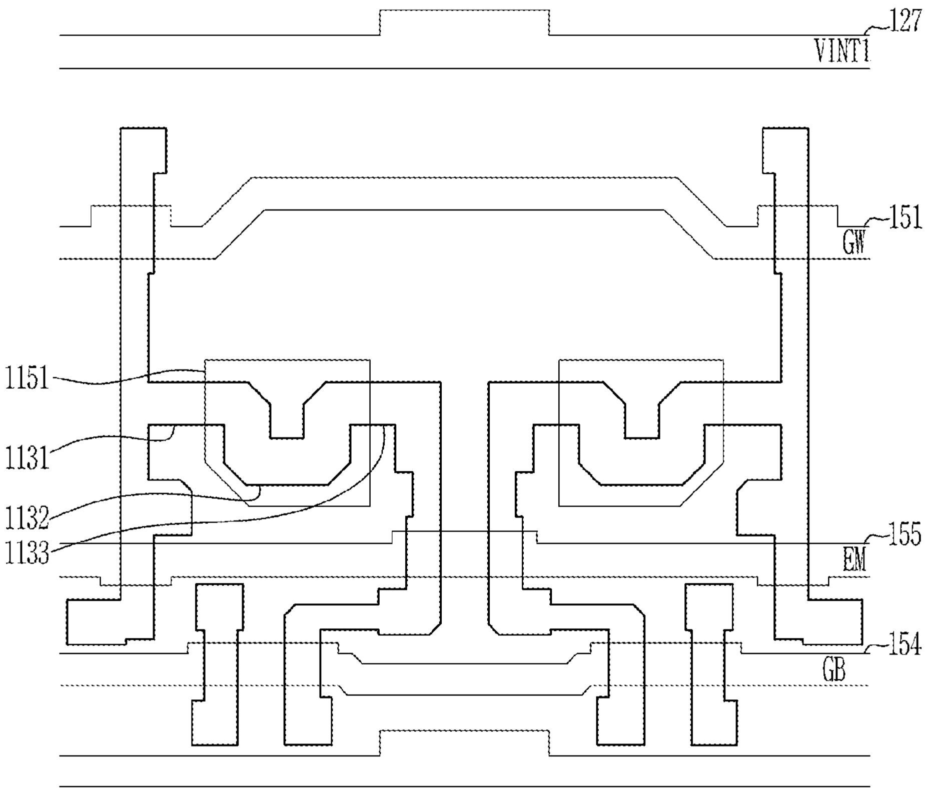

FIG. 22 illustrates a polycrystalline semiconductor layer and a first gate conductive layer together.

The first gate conductive layer may include molybdenum (Mo), aluminum (Al), copper (Cu), and/or titanium (Ti), and may have a single- or multilayered structure having the same.

The gate electrode (1151) of the driving transistor (T1) may overlap the channel (1132) of the driving transistor (T1) in a plan view.

The channel (1132) of the driving transistor (T1) may overlap the gate electrode (1151) of the driving transistor (T1) in a plan view.

The first gate conductive layer may further include a first initialization voltage line (127), a first scan line (151), an emission control line (155), and a bypass control line (154).

The first initialization voltage line (127), the first scan line (151), the emission control line (155), and the bypass control line (154) may extend in a substantially horizontal direction.

The first initialization voltage line (127) may be connected to the first region (4136) of the fourth transistor (T4).

The first scan line (151) may be connected to the gate electrode of the second transistor (T2).

The gate electrode of the fifth transistor (T5) and the gate electrode of the sixth transistor (T6) may be connected to the emission control line (155).

The gate electrode of the seventh transistor (T7) and the gate electrode of the eighth transistor (T8) may be connected to the bypass control line (154).

As described above, some pads (PD) of the pad portion (PA) may be positioned in the same layer as the first gate conductive layer.

After the first gate conductive layer including the gate electrode (1151) of the driving transistor (T1) is formed, a doping process may be performed.

The polycrystalline semiconductor layer that is covered by the first conductive layer may be doped, and a portion of the polycrystalline semiconductor layer that is not covered by the first conductive layer may be doped to have the same characteristic as the characteristic of a conductor.

In this case, the doping process may be performed with a p-type dopant, and the driving transistor (T1), the second transistor (T2), the fifth transistor (T5), the sixth transistor (T6), the seventh transistor (T7) including a polycrystalline semiconductor, and the eighth transistor (T8) may have a p-type transistor characteristic.

A second gate insulating layer (142) may be disposed on the first gate insulating layer (141) and the first gate conductive layer including the gate electrode (1151) of the driving transistor (T1).

The second gate insulating layer (142) may include a silicon oxide ($SiO_x$), a silicon nitride ($SiN_x$), or a silicon oxynitride ($SiO_xN_y$), and may have a single- or multilayered structure including the same.

A second gate conductive layer including the first storage electrode (1153) of the storage capacitor (Cst) may be positioned on the second gate insulating layer (142).

Figure 23:
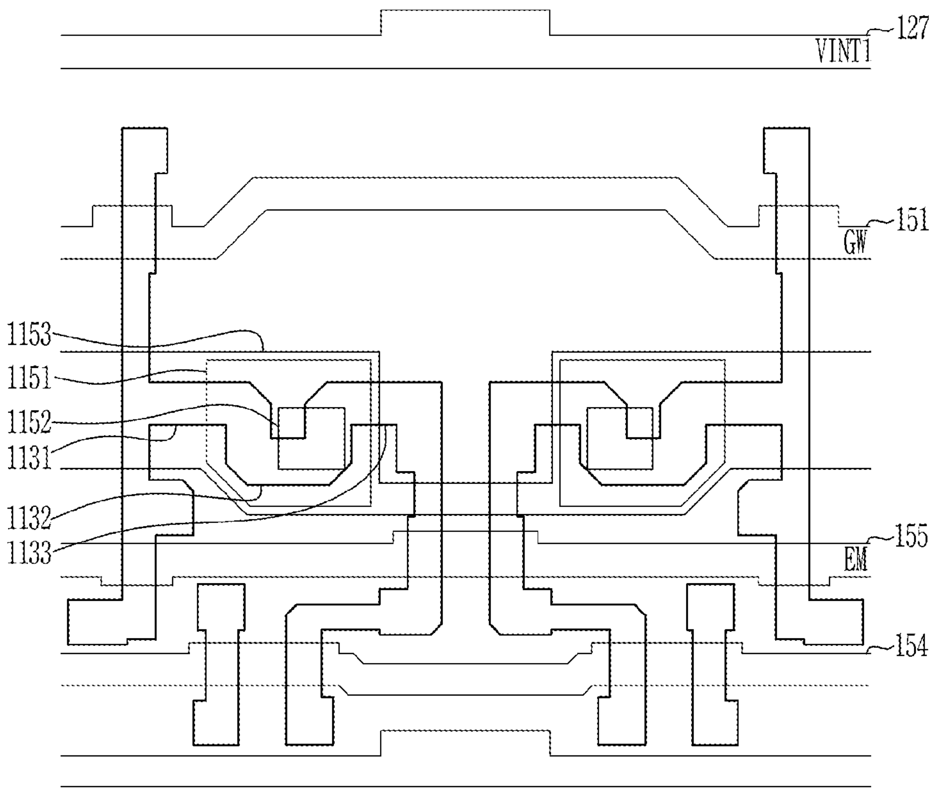

FIG. 23 illustrates the polycrystalline semiconductor layer, the first gate conductive layer, and the second gate conductive layer together.

The second gate conductive layer includes molybdenum (Mo), aluminum (Al), copper (Cu) silver (Ag), chromium (Cr), tantalum (Ta), titanium (Ti), and/or the like, and may have a single- or multilayered structure including the same.

The first storage electrode (1153) overlaps the gate electrode (1151) of the driving transistor (T1) to constitute the storage capacitor (Cst) in a plan view.

An opening (1152) is formed in the first storage electrode (1153) of the storage capacitor (Cst).

The opening (1152) of the first storage electrode (1153) of the storage capacitor (Cst) may overlap the gate electrode (1151) of the driving transistor (T1) in a plan view.

As described above, some pads (PD) of the pad portion (PA) may be positioned in the same layer as the second gate conductive layer.

A first interlayer insulating layer (161) may be disposed on the second gate conductive layer including the first storage electrode (1153) of the storage capacitor (Cst).

The first interlayer insulating layer (161) may include a silicon oxide ($SiO_x$), a silicon nitride ($SiN_x$), or a silicon oxynitride ($SiO_xN_y$), and may have a single- or multilayered structure including the same.

An oxide semiconductor layer including the channel (3137), the first region (3136), and the second region (3138) of the third transistor (T3), and the channel (4137), the first region (4136), and the second region (4138) of the fourth transistor (T4), may be positioned on the first interlayer insulating layer (161).

Figure 24:
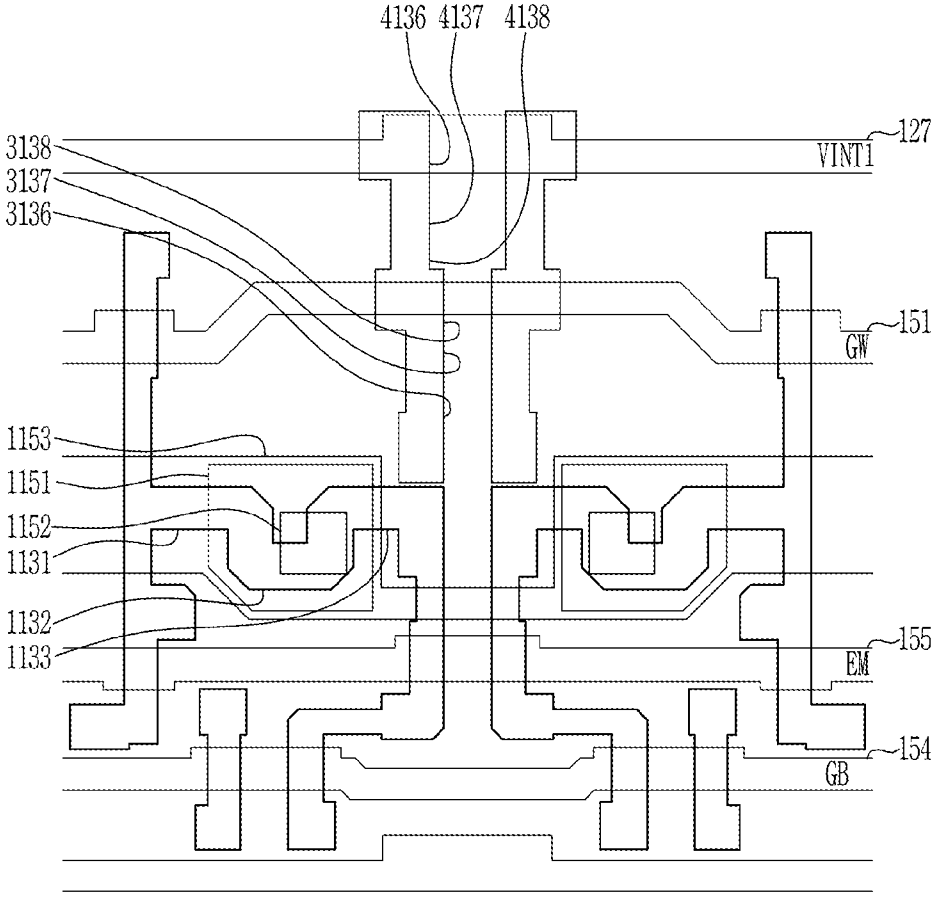

FIG. 24 illustrates the polycrystalline semiconductor layer, the first gate conductive layer, the second gate conductive layer, and an oxide semiconductor layer together.

The oxide semiconductor layer may include an indium-gallium-zinc oxide (IGZO) among In—Ga—Zn-based oxides.

The channel (3137), the first region (3136), and the second region (3138) of the third transistor (T3), and the channel (4137), the first region (4136), and the second region (4138) of the fourth transistor (T4), may be connected to each other to be formed integrally. The first region (3136) and the second region (3138) of the third transistor (T3) may be positioned at opposite sides of the channel (3137) of the third transistor (T3). The first region (4136) and the second region (4138) of the fourth transistor (T4) may be positioned at opposite sides of the channel (4137) of the fourth transistor (T4). The second region (3138) of the third transistor (T3) may be connected to the second region (4138) of the fourth transistor (T4).

A third gate insulating layer (143) may be positioned on the oxide semiconductor layer including the channel (3137), the first region (3136), and the second region (3138) of the third transistor (T3), and the channel (4137), the first region (4136), and the second region (4138) of the fourth transistor (T4). The third gate insulating layer (143) may include a silicon oxide ($SiO_x$), a silicon nitride ($SiN_x$), or a silicon oxynitride ($SiO_xN_y$), and may have a single- or multilayered structure including the same.

The third gate insulating layer (143) may be positioned on entire surfaces of the oxide semiconductor layer and the first interlayer insulating layer (161). The third gate insulating layer (143) may cover upper surfaces and side surfaces of the channel (3137), the first region (3136), and the second region (3138) of the third transistor (T3), and the channel (4137), the first region (4136), and the second region (4138) of the fourth transistor (T4). However, the present embodiment is not limited thereto, and the third gate insulating layer (143) may not be positioned on entire surfaces of the oxide semiconductor layer and the first interlayer insulating layer (161) in another embodiment. In an embodiment, for example, the third gate insulating layer (143) may overlap the channel (3137) of the third transistor (T3) in a plan view, and may not overlap the first region (3136) or the second region (3138) in a plan view. In addition, the third gate insulating layer (143) may overlap the channel (4137) of the fourth transistor (T4) in a plan view, and may not overlap the first region (4136) or the second region (4138) in a plan view.

Figure 25:
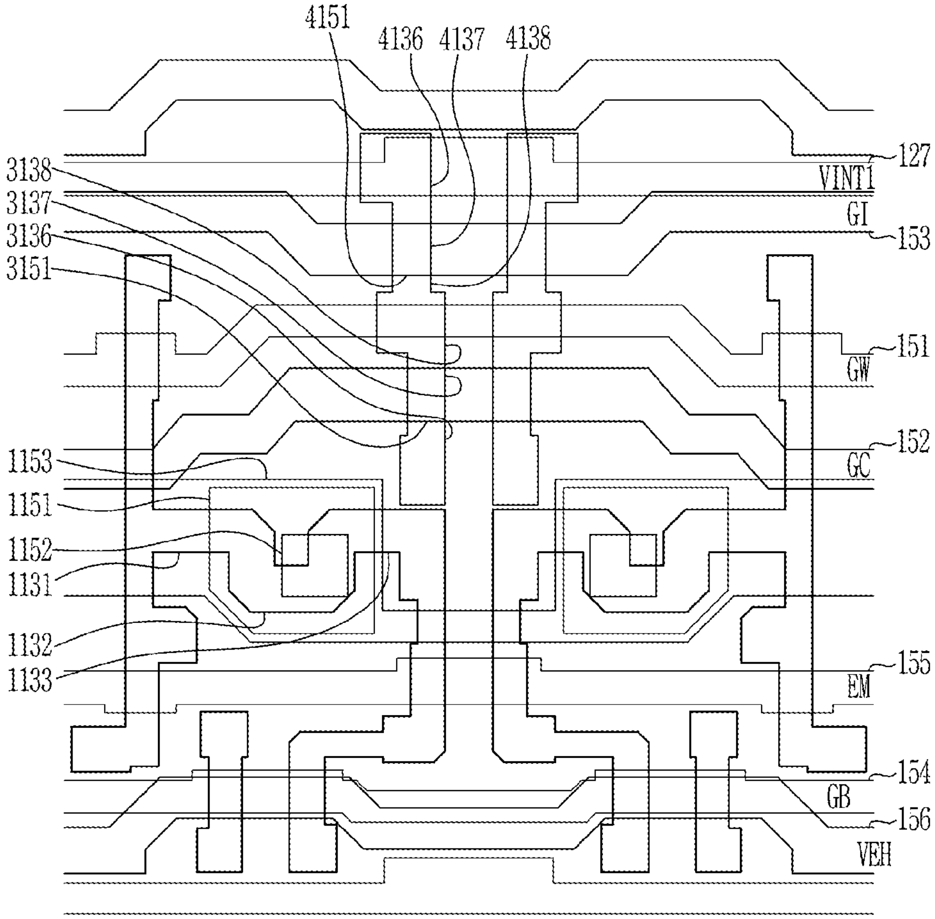

A third gate conductive layer including the gate electrode (3151) of the third transistor (T3) and the gate electrode (4151) of the fourth transistor (T4) may be positioned on the third gate insulating layer (143). FIG. 25 illustrates the polycrystalline semiconductor layer, the first gate conductive layer, the second gate conductive layer, the oxide semiconductor layer, and the third gate conductive layer together. The third gate conductive layer may include molybdenum (Mo), aluminum (Al), copper (Cu), and/or titanium (Ti), and may have a single- or multilayered structure including the same. In an embodiment, for example, the third gate conductive layer may include a lower layer including titanium and an upper layer including molybdenum.

The gate electrode (3151) of the third transistor (T3) may overlap the channel (3137) of the third transistor (T3) in a plan view. The gate electrode (4151) of the fourth transistor (T4) may overlap the channel (4137) of the fourth transistor (T4) in a plan view.

The third gate conductive layer may further include an initialization control line (153), a second scan line (152), and a reference voltage line (156). The initialization control line (153), the second scan line (152), and the reference voltage line (156) may extend substantially in a horizontal direction. The initialization control line (153) may be connected to the gate electrode (4151) of the fourth transistor (T4). The second scan line (152) may be connected to the gate electrode (3151) of the third transistor (T3). The reference voltage line (156) may be connected to the first region of the eighth transistor (T8).

As described above, some pads (PD) of the pad portion (PA) may be positioned in the same layer as the third gate conductive layer.

After the third gate conductive layer including the gate electrode (3151) of the third transistor (T3) and the gate electrode (4151) of the fourth transistor (T4) are formed, a doping process may be performed. A portion of the oxide semiconductor layer covered by the third gate conductive layer may not be doped, and a portion of the oxide semiconductor layer not covered by the third gate conductive layer may be doped to have the same characteristic as the conductor. The channel (3137) of the third transistor (T3) may be positioned under the gate electrode (3151) to overlap the gate electrode (3151) in a plan view. The first region (3136) and the second region (3138) of the third transistor (T3) may not overlap the gate electrode (3151) in a plan view. The channel (4137) of the fourth transistor (T4) may be positioned under the gate electrode (4151) to overlap the gate electrode (4151) in a plan view. The first region (4136) and the second region (4138) of the fourth transistor (T4) may not overlap the gate electrode (4151) in a plan view. The doping process of the oxide semiconductor layer may be performed with an n-type dopant, and the third transistor (T3) and the fourth transistor (T4) including the oxide semiconductor layer may have an n-type transistor characteristic.

A second interlayer insulating layer (162) may be positioned on the third gate conductive layer including the gate electrode (3151) of the third transistor (T3) and the gate electrode (4151) of the fourth transistor (T4). The second interlayer insulating layer (162) may include a silicon nitride ($SiN_x$), a silicon oxide ($SiO_x$), or a silicon oxynitride ($SiO_xN_y$), and may have a single- or multilayered structure including the same. The second interlayer insulating layer (162) may include a first opening (1165), a second opening (1166), a third opening (3165), a fourth opening (3166), a fifth opening (4165), and a sixth opening (4166).

The first opening (1165) may overlap at least a portion of the gate electrode (1151) of the driving transistor (T1) in a plan view. The first opening (1165) may be further formed on the third gate insulating layer (143), the first interlayer insulating layer (161), and the second gate insulating layer (142). The first opening (1165) may overlap the opening (1152) of the first storage electrode (1153) in a plan view. The first opening (1165) may be positioned inside the opening (1152) of the first storage electrode (1153). The second opening (1166) may overlap at least a portion of the second region (3138) of the third transistor (T3) in a plan view. The second opening (1166) may be further formed in the third gate insulating layer (143).

The third opening (3165) may overlap at least a portion of the second region (1133) of the driving transistor (T1) in a plan view. The third opening (3165) may be further formed in the third gate insulating layer (143), the first interlayer insulating layer (161), the second gate insulating layer (142), and the first gate insulating layer (141). The fourth opening (3166) may overlap at least a portion of the first region (3136) of the third transistor (T3) in a plan view. The fourth opening (3166) may be further formed in the third gate insulating layer (143).

The fifth opening (4165) may overlap at least a portion of the first region (4136) of the fourth transistor (T4) in a plan view. The fifth opening (4165) may be further formed in the third gate insulating layer (143). The sixth opening (4166) may overlap at least a portion of the first initialization voltage line (127) in a plan view. The sixth opening (4166) may be further formed on the third gate insulating layer (143), the first interlayer insulating layer (161), and the second gate insulating layer (142).

Figure 26:
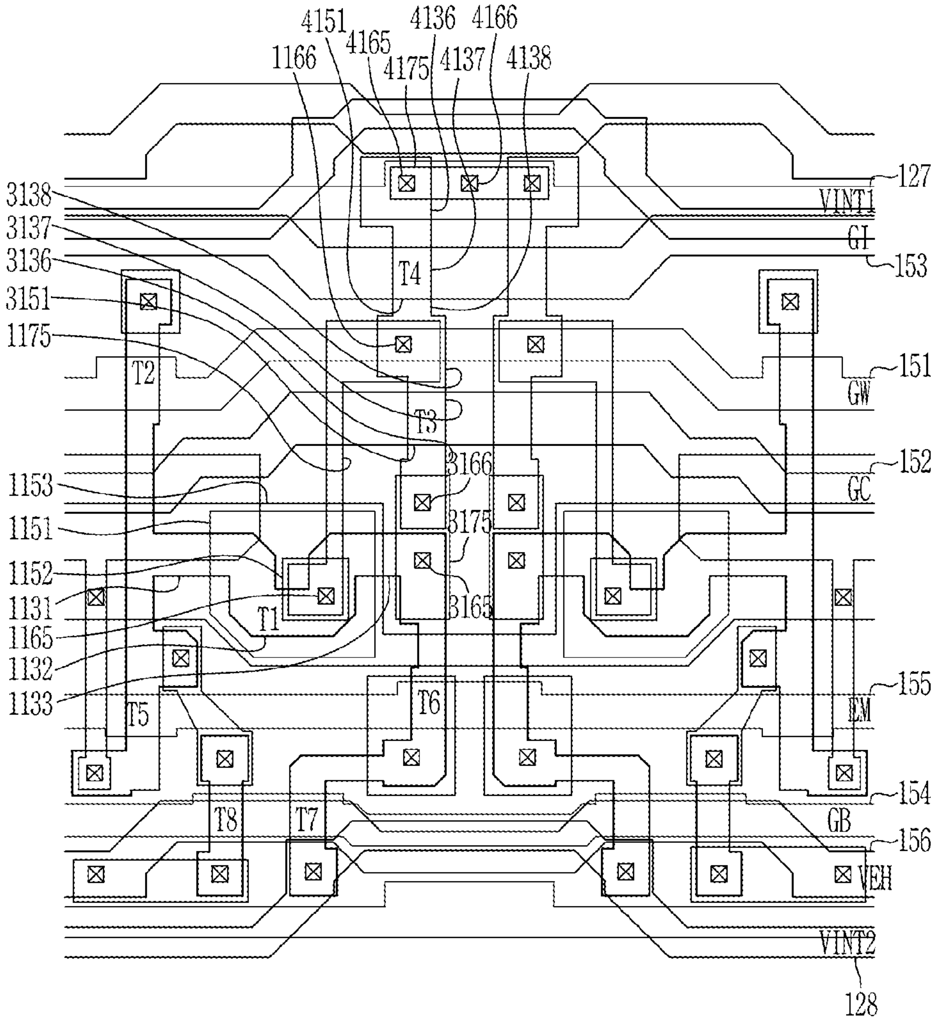

A first data conductive layer including a first connection electrode (1175), a second connection electrode (3175), and a third connection electrode (4175) may be positioned on the second interlayer insulating layer (162). FIG. 26 illustrates the polycrystalline semiconductor layer, the first gate conductive layer, the second gate conductive layer, the oxide semiconductor layer, the third gate conductive layer, and the first data conductive layer together. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), tantalum (Ta), titanium (Ti), tungsten (W), copper (Cu), and/or the like, and may have a single-layered structure or a multilayered structure including the material. In an embodiment, for example, the first data conductive layer may have a triple-layer structure of a lower film containing a refractory metal such as molybdenum, chromium, tantalum, or titanium, or an alloy thereof, an intermediate film containing an aluminum-based metal, a silver-based metal, or a copper-based metal having low resistivity, and an upper film containing a refractory metal such as molybdenum, chromium, tantalum, or titanium.

The first connection electrode (1175) may overlap the gate electrode (1151) of the driving transistor (T1) in a plan view. The first connection electrode (1175) may be connected to the gate electrode (1151) of the driving transistor (T1) through the first opening (1165) and the opening (1152) of the first storage electrode (1153). The first connection electrode (1175) may overlap the second region (3138) of the third transistor (T3) in a plan view. The first connection electrode (1175) may be connected to the second region (3138) of the third transistor (T3). Accordingly, the gate electrode (1151) of the driving transistor (T1) and the second region (3138) of the third transistor (T3) may be connected by the first connection electrode (1175).

The second connection electrode (3175) may overlap the second region (1133) of the driving transistor (T1) in a plan view. The second connection electrode (3175) may be connected to the second region (1133) of the driving transistor (T1) through the third opening (3165). The second connection electrode (3175) may overlap the first region (3136) of the third transistor (T3) in a plan view. The second connection electrode (3175) may be connected to the first region (3136) of the third transistor (T3) through the fourth opening (3166). Accordingly, the second region (1133) of the driving transistor (T1) and the first region (3136) of the third transistor (T3) may be connected by the second connection electrode (3175).

The third connection electrode (4175) may overlap the first region (4136) of the fourth transistor (T4) in a plan view. The third connection electrode (4175) may be connected to the first region (4136) of the fourth transistor (T4) through the fifth opening (4165). The third connection electrode (4175) may overlap the first initialization voltage line (127) in a plan view. The third connection electrode (4175) may be connected to the first initialization voltage line (127) through the sixth opening (4166). Accordingly, the first region (4136) of the fourth transistor (T4) and the first initialization voltage line (127) may be connected by the third connection electrode (4175).

The first data conductive layer may further include a second initialization voltage line (128). The second initialization voltage line (128) may extend substantially in a horizontal direction. The second initialization voltage line (128) may be connected to the second region of the seventh transistor (T7).

As described above, a first data layer (DAT1) of the pad portion (PA) may be disposed on the first data conductive layer. Accordingly, the first data layer (DAT1) may be disposed in the same layer as the first connection electrode (1175), the second connection electrode (3175), and the third connection electrode (4175). The first data layer (DAT1) may be disposed in the same layer as the second initialization voltage line (128).

A third interlayer insulating layer (180) may be positioned on the first data conductive layer including the first connection electrode (1175), the second connection electrode (3175), and the third connection electrode (4175).

The third interlayer insulating layer (180) may include an organic insulating material such as a general purpose polymer, for example—polymethylmethacrylate (PMMA) or polystyrene (PS), a polymer derivative having a phenolic group, an acrylic polymer, an imide polymer, a polyimide, or a siloxane polymer.

A second data conductive layer including the data line (171) and the driving voltage line (172) may be disposed on the third interlayer insulating layer (180). The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), tantalum (Ta), titanium (Ti), tungsten (W), copper (Cu), and/or the like, and may have a single-layered structure or a multilayered structure including the material.

The data line (171) and the driving voltage line (172) may mainly extend in the vertical direction. The data line (171) may be connected to the second transistor (T2). The data line (171) may be connected to the first region of the second transistor (T2). The driving voltage line (172) may be connected to the fifth transistor (T5). The driving voltage line (172) may be connected to the first region of the fifth transistor (T5). The driving voltage line (172) may be connected to the storage capacitor (Cst). The driving voltage line (172) may be connected to the first storage electrode (1153) of the storage capacitor (Cst). The first storage electrodes (1153) of the storage capacitors (Cst) of adjacent pixels may be connected to each other, and may extend in a substantially horizontal direction.

As described above, a second data layer (DAT2) of the pad portion (PA) may be disposed on the second data conductive layer. Accordingly, the second data layer (DAT2) may be disposed in the same layer as the data line (171) and the driving voltage line (172).

Although not illustrated, a passivation layer may be positioned on the second data conductive layer including the data line (171) and the driving voltage line (172), and an anode may be positioned on the passivation layer. The anode may be connected to the sixth transistor (T6), and may receive an output current of the driving transistor (T1). A partition wall may be positioned on the anode. An opening is formed in the partition wall, and the opening of the partition wall may overlap the anode in a plan view. A light emitting diode layer may be disposed within the opening of the partition wall. A cathode may be positioned on the light emitting element layer and the partition wall. The anode, the light emitting diode layer, and the cathode may constitute a light emitting diode (LED).

As described above, in the display device according to the present embodiment, the pads are positioned in six rows, and the distance between the pads and the wires was minimized by positioning adjacent pads and wires on different layers. Accordingly, a plurality of pads may be positioned in the same space, it is possible to implement a high-resolution display device, and thus multiple fingerprint realization, body composition, blood pressure, stress measurement and health-related sensors may be integrated.

While this disclosure has been described in connection with what is presently considered to be practical embodiments, it should be understood that the invention is not limited to the disclosed embodiments, but, on the contrary, is intended to cover various modifications and equivalent arrangements included within the spirit and scope of the appended claims.

What is claimed is:

1. A display device comprising:
a substrate including a display area and a pad portion outside the display area; and
a plurality of pads positioned in the pad portion,
wherein the plurality of pads are positioned in six rows, the six rows are arranged along a first direction,
pads adjacent in the first direction among the plurality of pads are positioned on different layers,
pads adjacent to each other in a second direction among the plurality of pads are positioned in a same layer, and
the second direction is perpendicular to the first direction and parallel to a direction in which the rows extend.

2. The display device of claim 1, wherein
the plurality of pads are connected to a plurality of wires, and
1 to 5 wires of the plurality of wires are positioned between two pads of the plurality of pads, which are adjacent to each other in the second direction.

3. The display device of claim 1, wherein
a distance between the pads adjacent in the second direction is in a range of about 25 micrometers (μm) to about 30 μm.

4. The display device of claim 1, wherein
a width of each of the plurality of pads in the second direction is in a range of about 5 μm to about 10 μm.

5. The display device of claim 2, wherein
a width of each of the plurality of wires in the second direction is in a range of about 2 μm to about 4 μm.

6. The display device of claim 2, wherein
a distance between two wires adjacent in the second direction among the plurality of wires is in a range of about 0.75 μm to about 4 μm.

7. The display device of claim 2, wherein
two wires adjacent in the second direction among the plurality of wires are positioned on different layers from each other.

8. The display device of claim 2, wherein
some of the plurality of wires include one or more bent portions.

9. The display device of claim 1, wherein
a total number of the pads positioned in the pad portion is in a range of 6500 to 7500.

10. The display device of claim 1, wherein
the pad portion includes:
first pads positioned in a same layer as a first gate conductive layer of the display area; and
second pads positioned in a same layer as a second gate conductive layer of the display area,
wherein the first pads and the second pads are included in the plurality of pads and alternately positioned along the first direction, and
only the first pads or only the second pads are positioned in a same row extending in the second direction.

11. The display device of claim 1, wherein
the pad portion include:
second pads positioned in a same layer as a second gate conductive layer of the display area; and
third pads positioned in a same layer as a third gate conductive layer of the display area,
wherein the second pads and the third pads are included in the plurality of pads and alternately positioned along the first direction, and
only the second pads or only the third pads are positioned in a same row extending in the second direction.

12. The display device of claim 1, wherein
the pad portion include:
first pads positioned in a same layer as a first gate conductive layer of the display area; and
third pads positioned in a same layer as a third gate conductive layer of the display area,
wherein the first pads and the third pads are included in the plurality of pads and alternately positioned along the first direction, and
only the first pads or only the third pads are positioned in a same row extending in the second direction.

13. The display device of claim 12, further comprising:
first wires connected to the first pads, respectively, and positioned in a same layer as the first pads;
third wires connected to the third pads, respectively, and positioned in a same layer as the third pads,
wherein the first wires and the third wires partially overlap in a direction perpendicular to a major surface of the substrate.

14. The display device of claim 1, further comprising
a plurality of auxiliary pads positioned on the plurality of pads and electrically connected to the plurality of pads,
wherein the auxiliary pads are positioned in a same layer as a data conductive layer of the display area.

* * * * *